(12) United States Patent
Igarashi et al.

(10) Patent No.: US 7,737,624 B2
(45) Date of Patent: Jun. 15, 2010

(54) ORGANIC ELECTROLUMINESCENT DEVICE

(75) Inventors: Tatsuya Igarashi, Kanagawa (JP); Fumito Nariyuki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 402 days.

(21) Appl. No.: 10/566,723

(22) PCT Filed: Aug. 3, 2004

(86) PCT No.: PCT/JP2004/011414
§ 371 (c)(1), (2), (4) Date: Feb. 2, 2006

(87) PCT Pub. No.: WO2005/013387

PCT Pub. Date: Oct. 2, 2005

(65) Prior Publication Data
US 2006/0192482 A1     Aug. 31, 2006

(30) Foreign Application Priority Data
Aug. 4, 2003     (JP)     ............. 2003-285755

(51) Int. Cl.
H01J 1/62     (2006.01)
H01J 63/04     (2006.01)

(52) U.S. Cl. .................. 313/504; 313/502; 313/503; 313/506; 428/690; 428/917; 257/40; 252/301.16

(58) Field of Classification Search ......... 313/502–504, 313/506; 428/690, 917; 257/40; 252/301.16
See application file for complete search history.

(56) References Cited

U.S. PATENT DOCUMENTS 5,698,858 A     12/1997     Borner 5,756,224 A     5/1998     Borner et al.
(Continued)

FOREIGN PATENT DOCUMENTS

DE     44 28 450 A1     2/1996
(Continued)

OTHER PUBLICATIONS

D'Andrade, Brian W. et al., Applied Physics Letters, American Institute of Physics, New York, US, vol. 79, No. 7, Aug. 2001, pp. 1045-1047, XP012030036, ISSN: 0003-6951.
(Continued)

Primary Examiner—Nimeshkumar D. Patel
Assistant Examiner—Thomas A Hollweg
(74) Attorney, Agent, or Firm—Birch, Stewart, Kolasch & Birch, LLP

(57) ABSTRACT

An organic electroluminescent device having at least one organic layer containing a light-emitting layer between a pair of electrodes, wherein the organic electroluminescent device contains a compound emitting fluorescence at a time that voltage is applied, and the light emission at the time that voltage is applied is mainly derived from the light emission of a fluorescent compound, and the external quantum efficiency of the device is 6% or more. It is preferable that the organic electroluminescent device contain an amplifying agent performing the function of amplifying the number of singlet excitons generated at the time that voltage is applied, thus amplifying the intensity of the light emission. The amplifying agent is a transition metal complex, in particular, an iridium complex, a platinum complex, a rhenium complex, a ruthenium complex, a palladium complex, a rhodium complex, a copper complex or a rare earth device complex. The compound emitting fluorescence is preferably a fused aromatic compound.

14 Claims, 2 Drawing Sheets

U.S. PATENT DOCUMENTS

| | | | |
|---|---|---|---|
| 5,861,219 A * | 1/1999 | Thompson et al. | 428/690 |
| 6,310,360 B1 * | 10/2001 | Forrest et al. | 257/40 |
| 6,582,875 B1 | 6/2003 | Kay et al. | |
| 7,011,897 B2 | 3/2006 | Thompson et al. | |
| 2002/0028329 A1 | 3/2002 | Ise et al. | |
| 2002/0096995 A1 | 7/2002 | Mishima et al. | |
| 2002/0125818 A1 * | 9/2002 | Sato et al. | 313/504 |
| 2002/0146589 A1 * | 10/2002 | Akiyama et al. | 428/690 |
| 2003/0218418 A9 * | 11/2003 | Sato et al. | 313/504 |
| 2005/0142383 A1 | 6/2005 | Igarashi et al. | |
| 2005/0158582 A1 | 7/2005 | Ise et al. | |
| 2005/0164032 A1 | 7/2005 | Ise et al. | |
| 2005/0214575 A1 | 9/2005 | Igarashi et al. | |
| 2006/0192482 A1 | 8/2006 | Igarashi et al. | |
| 2007/0122651 A1 | 5/2007 | Igarashi | |

FOREIGN PATENT DOCUMENTS

| | | |
|---|---|---|
| EP | 1175128 A2 | 1/2002 |
| WO | WO-00/70655 A2 | 11/2000 |
| WO | WO-01/08230 A1 | 2/2001 |
| WO | WO-01/91203 A2 | 11/2001 |

OTHER PUBLICATIONS

Jason Brooks et al, "Synthesis and Characterization of Phosphorescent Cyclometalated Platinum Complexes", Inorganic Chemistry, 2002, vol. 41, No. 12, pp. 3055-3066, American Chemical Society.

* cited by examiner

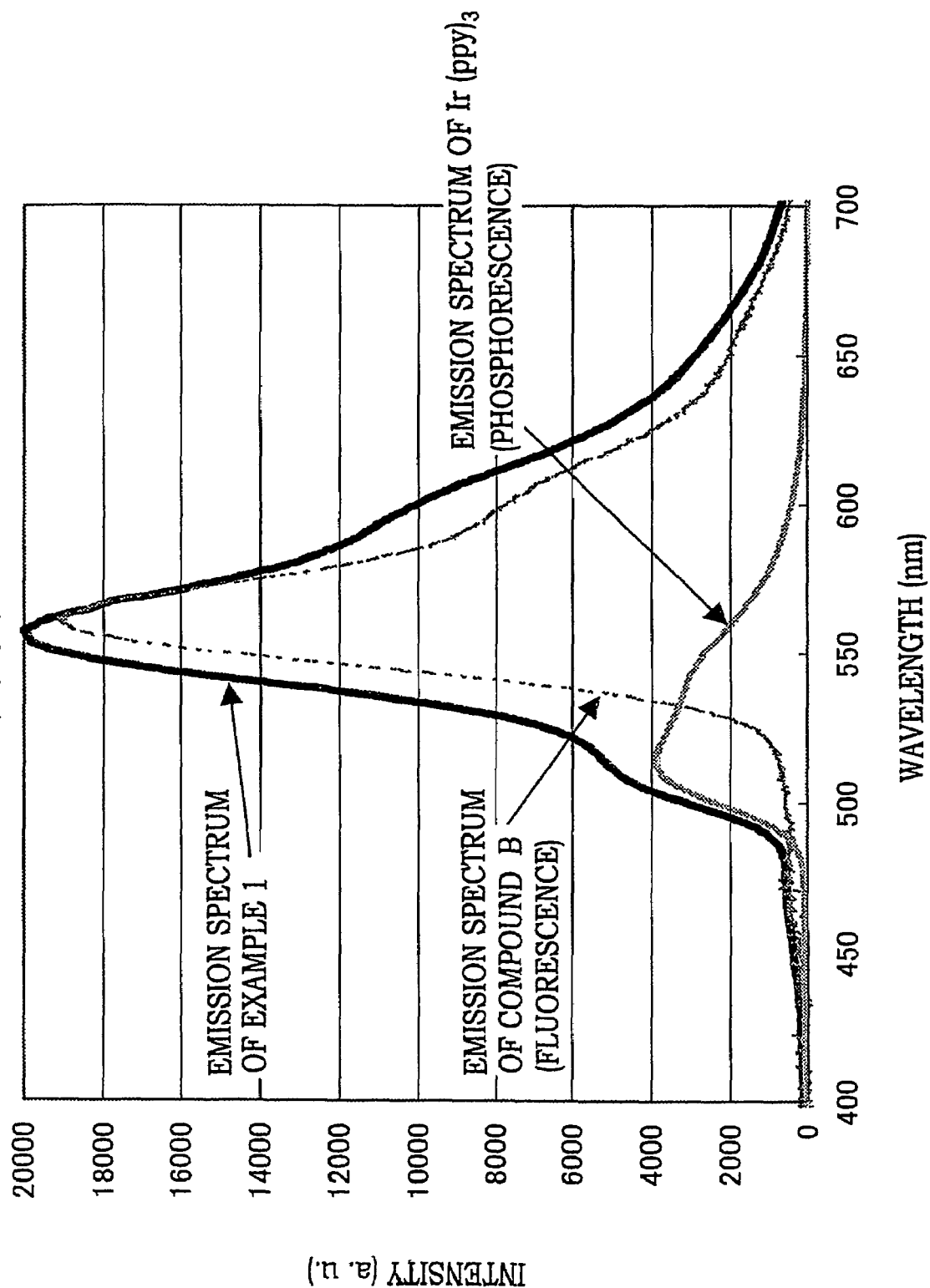

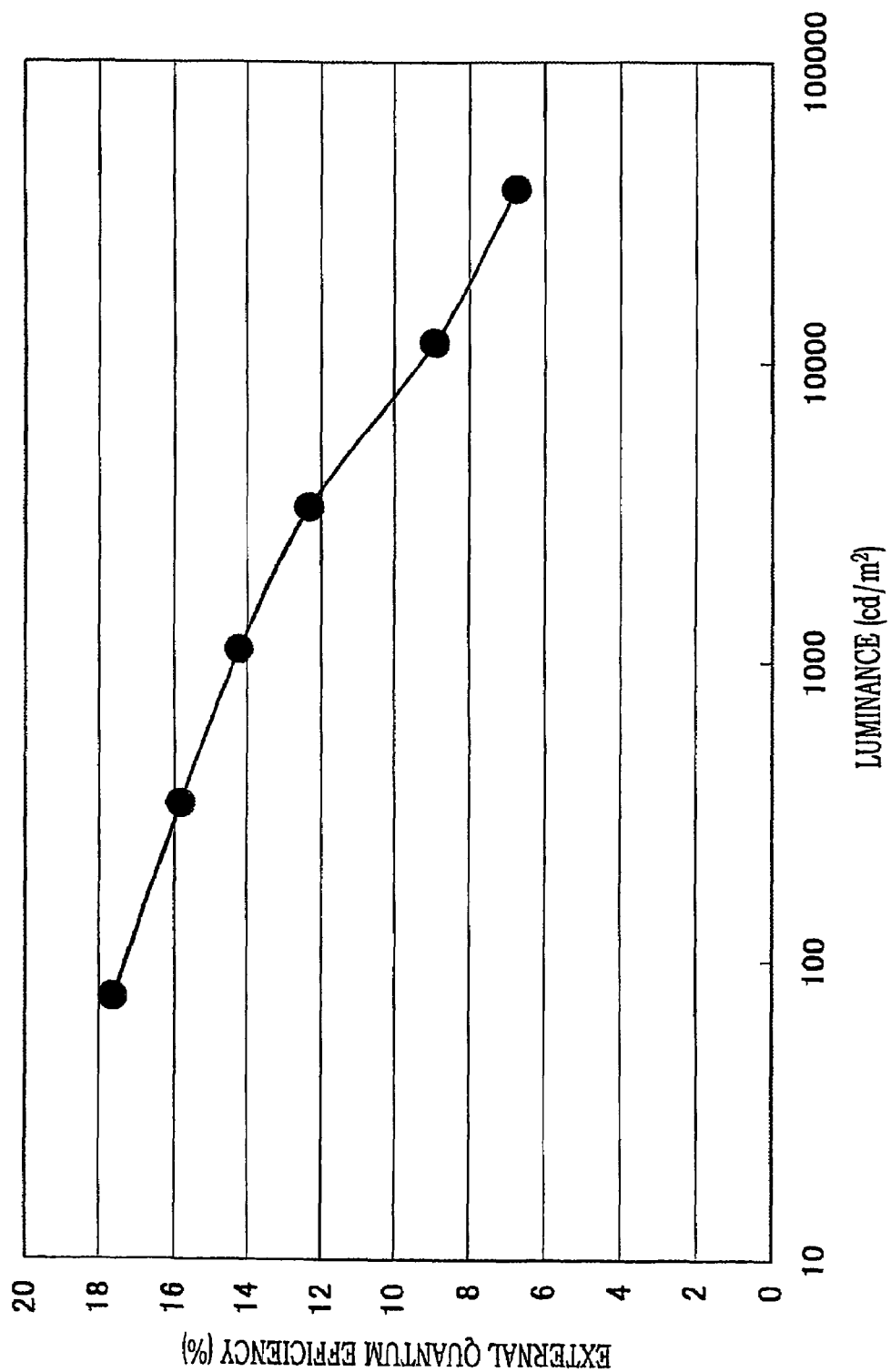

ORGANIC ELECTROLUMINESCENT DEVICE

BACKGROUND OF THE INVENTION

1. Technical Field

The present invention relates to a light-emitting device capable of converting electric energy to light, particularly an organic electroluminescent device, hereinafter on occasion referred to as a "device", a "light-emitting device", an "EL device" or an "organic EL device".

2. Related Art

Organic electroluminescent (EL) devices have been attracting attention as promising display devices for obtaining luminescence of a high intensity at a low driving voltage. An important characteristic value of an organic electroluminescent device is external quantum efficiency. External quantum efficiency is calculated by "external quantum efficiency $\phi$=number of photons discharged from a device/number of electrons injected into a device". The higher the value of external quantum efficiency, the lower the power consumption of the device, and thereby a device having a higher value of external quantum efficiency is advantageous.

The external quantum efficiency of the organic electroluminescent device is determined by "external quantum efficiency $\phi$=internal quantum efficiency×light extraction efficiency". In an organic EL device which uses fluorescence from an organic compound, the limit value of the external quantum efficiency is considered to be about 5% since the limit value of internal quantum efficiency is 25% and light extraction efficiency is about 20%.

A device which uses a triplet light-emitting material (phosphorescent light emitting material) has been reported as a method for improving the external quantum efficiency of the device by enhancing the internal quantum efficiency of the organic electroluminescent device (for instance, see WO 00/70655). In comparison with a conventional device using fluorescence (singlet light-emitting device), this device can enhance external quantum efficiency and a maximum value of external quantum efficiency of 8% has been attained (external quantum efficiency at 100 cd/m² is 7.5%). However, since a phosphorescent light emission from a heavy atomic metal complex is used, the response of light emission has been slow, and an improvement in durability also remains to be desired.

A singlet light-emitting device that uses energy translation from triplet excitons to singlet excitons has been reported as a method for alleviating this problem (for instance, see WO 01/8230).

However, the maximum value of external quantum efficiency of the device described in the document is 3.3%, and this does not exceed the external quantum efficiency ($\phi$=5%) of a conventional singlet light-emitting device. There is, therefore, scope for further improvement in the device.

It is accordingly an object of the present invention to provide a light-emitting device with a superior light-emitting efficiency.

SUMMARY OF THE INVENTION

The present invention has been made in view of the above circumstances and provides an organic electroluminescent device having at least one organic layer containing a light-emitting layer between a pair of electrodes, wherein the organic electroluminescent device contains a compound emitting fluorescence at a time that voltage is applied, and light emission, at the time that voltage is applied, is mainly derived from light emission of a fluorescent compound, and wherein the external quantum efficiency of the device is 6% or more.

The internal quantum efficiency of the organic electroluminescent device is preferably 30% or more.

It is preferable that the organic electroluminescent device contain a compound, hereinafter, referred to as an "amplifying agent", which can perform a function of amplifying the number of singlet excitons generated at the time that voltage is applied, and thus amplify the intensity of light emission.

The invention can provide an organic electroluminescent device that can emit light with a high degree of efficiency.

BRIEF DESCRIPTION OF THE DRAWINGS

FIG. 1 shows data of the emission spectrums of Example 1, a compound (B) and Ir (ppy)$_3$.

FIG. 2 shows the relationship between luminance and the external quantum efficiency of a device described in Example 1.

DETAILED DESCRIPTION OF THE EMBODIMENTS

The organic electroluminescent device of the present invention is a device having at least one organic layer containing a light-emitting layer between a pair of electrodes, a device containing a compound, hereinafter also referred to as a "fluorescent light-emitting compound", emitting fluorescence at a time that voltage is applied, and wherein light emission, at the time that voltage is applied, is mainly derived from the light emission of the fluorescent compound, and the external quantum efficiency of the organic electroluminescent device is 6% or more.

In addition to the light-emitting layer disposed as the organic layer between the pair of electrodes, the device may also have additional layers such as a hole injecting layer, a hole-transporting layer, and an electron-transporting layer. Moreover, each of these layers may perform functions other than the ones implied by the actual designations of the layers concerned.

"Light emission at a time that voltage is applied is mainly derived from the light emission of a fluorescent compound" means, in other words, that light emission (fluorescence) from the singlet excitons is more than 50% of the luminescence component obtained from the device, and that light emission (phosphorescence) from triplet excitons is less than the remaining 50%. Preferably, fluorescence is 70% or more of the luminescence component obtained from the device, and the phosphorescence is 30% or less. More preferably, the fluorescence is 80% or more of the luminescence component obtained from the device, and the phosphorescence is 20% or less. Still more preferably, the fluorescence is 90% or more, and the phosphorescence is 10% or less. It is preferable that the fluorescent light emission enhances mainly the response of the light emission and durability, and in addition inhibits a reduction in effectiveness at a time that there is high degree of luminance (for instance, 1000 cd/m² or more).

In the interests of lower power consumption and a higher driving durability, the external quantum efficiency of the device needs to be 6% or more, preferably 8% or more, more preferably 10% or more, still more preferably 13% or more, and particularly preferably 15% or more.

The maximum value of the external quantum efficiency at a time that the device is driven at 20° C., and the value of the external quantum efficiency in the vicinity of 100 to 300 cd/m², preferably at 200 cd/m², at a time that the device is driven at 20° C., can each be used as the numerical value of the external quantum efficiency.

In the invention, the external quantum efficiency at 200 cd/m² can be calculated by applying a constant DC voltage to the resulting EL device for emitting with a Source-Measure Unit Model 2400 (trade name, manufactured by Toyo Corp.), and measuring luminance with a luminance meter BM-8 (trade name, manufactured by Topcon Corp.).

The external quantum efficiency of the device can be obtained by measuring the light-emitting luminance, emission spectrum and current density, and by calculating the relative luminosity curve on the basis of the results. In other words, the electron number input can be calculated by using the current density value. Then the light-emitting luminance can be converted into a number of photons emitting light by means of an integral calculation which uses the emission spectrum and the relative luminosity curve (spectrum). From these, the external quantum efficiency (%) can be calculated by "(number of photons emitting light/number of electrons input into the device)×100".

From the points of view of power consumption and durability, the internal quantum efficiency of the device is preferably 30% or more, more preferably 50% or more, and still more preferably 70% or more. The internal quantum efficiency of the device is calculated by "internal quantum efficiency=external quantum efficiency/light extraction efficiency". A typical organic EL device has a light extraction efficiency of about 20%, but the light extraction efficiency can be adjusted to 20% or more by finessing factors such as the shape of a substrate, the shape of an electrode, the film thickness of an organic layer, the film thickness of an inorganic layer, the refractive index of the organic layer, and the refractive index of the inorganic layer. When the refractive index of the light-emitting layer is n, the value of the light extraction efficiency can be calculated by $n^2/2$.

The light-emitting device of the invention preferably contains a compound, hereinafter referred to as "amplifying agent", which performs the functions of amplifying the number of singlet excitons generated at a time that voltage is applied and then amplifying the intensity of the light emission of the compound emitting fluorescence at a time that voltage is applied.

As long as the amplifying agent amplifies the number of singlet excitons generated at a time that voltage is applied, the amplifying agent is not particularly limited. Examples of amplifying agents include a compound capable of performing a function or transferring energy from triplet excitons generated in the light-emitting device to the singlet excitons of the compound emitting fluorescence, or to the host material. In this respect, the host material performs a function of providing a site for the recombination of the hole and electron injected, for or transporting energy from the excitons generated by the recombination to the light-emitting material (guest material).

Examples of compounds which can perform these functions satisfactorily include a compound such as a transition metal complex that emits phosphorescence at 20° C. (the quantum yield of the phosphorescence is preferably 50% or more, more preferably 70% or more, and particularly preferably 90% or more).

The transition metal complex is preferably an iridium complex, a platinum complex, a rhenium complex, a ruthenium complex, a palladium complex, a rhodium complex, a copper complex or a rare earth element complex. The iridium complex and the platinum complex are more preferable in terms of phosphorescence quantum yield. The transition metal complexes may be used singly or in combination of two or more.

The concentration of amplifying agent in the light-emitting layer, is preferably, but not particularly limited to, 9 weight % or less, and is more preferably within a range of from 0.1 weight % to 9 weight %, still more preferably within a range of from 1 weight % to 8 weight %, particularly preferably within a range of from 2 weight % to 7 weight %, and most preferably within a range of from 3 weight % to 6 weight %. From the point of view of improving efficiency and durability of the device it is preferable that the concentration be within these values.

In order to obtain bright light emission visually, the compound emitting fluorescence of the invention is preferably, but not limited to, a compound having a maximum light-emitting wavelength 580 nm or less from the compound emitting fluorescence, more preferably within a range of from 350 nm to 565 nm, and still more preferably within a range of from 400 nm to 565 nm. The value measured in a solid film at 20° C. can be used as the maximum wavelength of the light emission.

The fluorescent quantum yield of the compound emitting fluorescence of the invention is preferably 70% or more, and more preferably 80%, still more preferably 90% or more, and particularly preferably 95% or more. In this context, the fluorescent quantum yield is represented by "fluorescent quantum yield (%)=(number of photons of fluorescence/number of photons absorbed)×100".

The value measured in a solid film or in a solution at 20° C. can be used as the fluorescent quantum yield. The fluorescent quantum yield can be measured by comparing emission intensity with a material (fluorescein, anthracene and rhodamine or the like) of which the value of the fluorescent quantum yield is already known.

The compound emitting fluorescence related to the invention is preferably a fused aromatic compound. Examples of fused aromatic compounds include a compound having a fused aromatic hydrocarbon ring, for example, naphthalene, anthracene, phenanthrene, acenaphthylene, pyrene, perylene, fluoranthene, tetracene, chrysene, pentasene, coronene and derivatives thereof (tetra-t-butylpyrene, binaphthyl, rubrene, benzopyrene, benzoanthracene or the like); and a compound having a fused aromatic hetero ring, for example quinoline, quinoxaline, benzoimidazole, benzoxazole, benzoimidazole, imidazopyridine, azaindole and derivatives thereof (for example, bisbenzoxazolylbenzen and benzquinoline or the like). The compound having the fused aromatic hydrocarbon ring is preferable.

As the compound having the fused aromatic hydrocarbon ring, in terms of durability and efficiency, naphthalene, anthracene, phenanthrene, acenaphthylene, pyrene, perylene, fluoranthene, tetracene, pentacene, and derivatives thereof are preferable, and more preferable are anthracene, fluoranthene, pyrene, perylene, tetracene, and derivatives thereof. Fluoranthene derivatives, pyrene derivatives, perylene derivatives and tetracene derivatives are still more preferable, and particularly preferable are tetracene derivatives.

The compounds may be used singly or in combination of two or more.

The compounds represented by formulae (1) to (5) are preferable as the compound having the fused aromatic hydrocarbon ring, and the compounds represented by formulae (3), (4) and (5) are more preferable. The compounds represented by formulae (4) and (5) are still more preferable, and particularly preferable is the compound represented by formula (4).

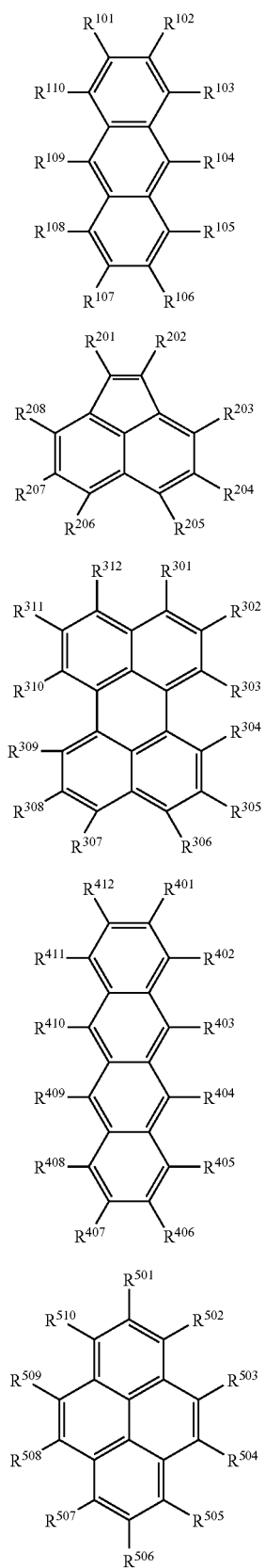

Formula (1)
Formula (2)
Formula (3)
Formula (4)
Formula (5)

Hereinafter, the formula (1) will be described.

$R^{101}$, $R^{102}$, $R^{103}$, $R^{104}$, $R^{105}$, $R^{106}$, $R^{107}$, $R^{108}$, $R^{109}$ and $R^{110}$ each represents a hydrogen atom or a substituent.

Examples of substituents include an alkyl group (preferably having 1 to 30 carbon atoms, more preferably 1 to 20 carbon atoms and still more preferably 1 to 10 carbon atoms, such as methyl, ethyl, iso-propyl, tert-butyl, n-octyl, n-desyl, n-hexadecyl, cyclopropyl, cyclopenthyl and cyclohexyl); an alkenyl group (preferably having 2 to 30 carbon atoms, more preferably 2 to 20 carbon atoms and still more preferably 2 to 10 carbon atoms, such as vinyl, allyl, 2-butenyl and 3-pentenyl); an alkynyl group (preferably having 2 to 30 carbon atoms, more preferably 2 to 20 carbon atoms and still more preferably 2 to 10 carbon atoms, such as propargyl and 3-pentenyl); an aryl group (preferably having 6 to 30 carbon atoms, more preferably 6 to 20 carbon atoms and still more preferably 6 to 12 carbon atoms, such as phenyl, p-methylphenyl, naphthyl and anthranyl); an amino group (preferably having 0 to 30 carbon atoms, more preferably 0 to 20 carbon atoms and still more preferably 0 to 10 carbon atoms, such as amino, methylamino, dimethylamino, diethylamino, dibenzylamino, diphenylamino and ditolylamino); an alkoxy group (preferably having 1 to 30 carbon atoms, more preferably 1 to 20 carbon atoms and still more preferably 1 to 10 carbon atoms, such as methoxy, ethoxy, butoxy and 2-ethylhexyloxy); an aryloxy group (preferably having 6 to 30 carbon atoms, more preferably 6 to 20 carbon atoms and still more preferably 6 to 12 carbon atoms, such as phenyloxy, 1-naphthyloxy and 2-naphthyloxy); a heterocyclic oxy group (preferably having 1 to 30 carbon atoms, more preferably 1 to 20 carbon atoms and sill more preferably 1 to 12 carbon atoms, such as pyridyloxy, pyradyloxy, pyrimidyloxy and quinolyloxy); an acyl group (preferably having 1 to 30 carbon atoms, more preferably 1 to 20 carbon atoms and still more preferably 1 to 12 carbon atoms, such as acetyl, benzoyl, formyl and pivaloyl); an alkoxy carbonyl group (preferably having 2 to 30 carbon atoms, more preferably 2 to 20 carbon atoms and still more preferably 2 to 12 carbon atoms, such as methoxycarbonyl and ethoxycarbonyl); an aryloxycarbonyl group (preferably having 7 to 30 carbon atoms, more preferably 7 to 20 carbon atoms and still more preferably 7 to 12 carbon atoms, such as phenyloxycarbonyl); an acyloxy group (preferably having 2 to 30 carbon atoms, more preferably 2 to 20 carbon atoms and still more preferably 2 to 12 carbon atoms, such as acetoxy and benzoyloxy); an acylamino group (preferably having 2 to 30 carbon atoms, more preferably 2 to 20 carbon atoms and still more preferably 2 to 10 carbon atoms, such as acetylamino and benzoylamino); an alkoxycarbonylamino group (preferably having 2 to 30 carbon atoms, more preferably 2 to 20 carbon atoms and still more preferably 2 to 12 carbon atoms, such as methoxycarbonylamino); an aryloxycarbonylamino group (preferably having 7 to 30 carbon atoms, more preferably 7 to 20 carbon atoms and still more preferably 7 to 12 carbon atoms, such as phenyloxycarbonylamino); a sulfonylamino group (preferably having 1 to 30 carbon atoms, more preferably 1 to 20 carbon atoms and still more preferably 1 to 12 carbon atoms, such as methanesulfonylamino and benzenesulfonylamino); a sulfamoyl group (preferably having 0 to 30 carbon atoms, more preferably 0 to 20 carbon atoms and still more preferably 0 to 12 carbon atoms, such as sulfamoyl, methylsulfamoyl, dimethylsulfamoyl and phenylsulfamoyl); a carbamoyl group (preferably having 1 to 30 carbon atoms, more preferably 1 to 20 carbon atoms and still more preferably 1 to 12 carbon atoms, such as carbamoyl, methylcarbamoyl, diethylcarbamoyl and phenylcarbamoyl); an alkylthio group (preferably having 1 to 30 carbon atoms, more preferably 1 to 20 carbon atoms and still more preferably 1 to 12 carbon atoms, such as methylthio and ethylthio); an arylthio group (preferably having 6 to 30 carbon atoms, more preferably 6 to 20 carbon atoms and still more preferably 6 to 12 carbon atoms, such as phenylthio); a heterocyclic thio group (preferably having 1 to 30 carbon atoms, more preferably 1 to 20 carbon atoms and still more preferably 1 to 12 carbon atoms, such as pyridylthio, 2-benzimidazolylthio, 2-benzoxazolylthio and 2-benzothiazolylthio); a sulfonyl group (preferably having 1 to 30 carbon atoms, more preferably 1 to 20 carbon atoms and still more preferably 1 to 12 carbon atoms, such as mesyl and tosyl); a sulfinyl group (preferably having 1 to 30 carbon atoms, more preferably 1 to 20 carbon atoms and still more preferably 1 to 12 carbon atoms, such as methanesulfinyl and benzenesulfinyl); a ureido group (preferably having 1 to 30 carbon atoms, more preferably 1 to 20 carbon atoms and still more preferably 1 to 12 carbon atoms, such as ureido, methylureido and phenylureido); a phosphoric acid amido group (preferably having 1 to 30 carbon atoms, more preferably 1 to 20 carbon atoms and still more preferably 1 to 12 carbon atoms, such as diethyl phosphoric acid amido and phenylphosphoric acid amido); a hydroxyl group; a mercapto group; a halogen atom (such as a fluorine atom, a chlorine atom, a bromine atom and an iodine atom); a cyano group; a sulfo group; a carboxyl group; a nitro group; a hydroxamic acid group; a sulfino group; a hydrazino group; an imino group; a heterocyclic group (preferably having 1 to 30 carbon atoms and more preferably 1 to 12 carbon atoms, and containing as a hetero atom a nitrogen atom, an oxygen atom or a sulfur atom, such as imidazolyl, pyridyl, quinolyl, furyl, thienyl, piperidyl, morpholino, benzoxazolyl, benzimidazolyl, benzthiazolyl, a carbazolyl group and an azepinyl group); a silyl group (preferably having 3 to 40 carbon atoms, more preferably 3 to 30 carbon atoms and still more preferably 3 to 24 carbon atoms, such as trimethylsilyl and triphenylsilyl); and a silyloxy group (preferably having 3 to 40 carbon atoms, more preferably 3 to 30 carbon atoms and still more preferably 3 to 24 carbon atoms, such as trimethylsilyloxy and triphenylsilyloxy. These substituents may in turn be substituted.

The substituents represented by $R^{101}$, $R^{102}$, $R^{103}$, $R^{104}$, $R^{105}$, $R^{106}$, $R^{107}$, $R^{108}$, $R^{109}$ and $R^{110}$ may be combined with each other to form a condensed ring structure (for instance, a benzo-condensed ring). $R^{101}$, $R^{102}$, $R^{103}$, $R^{104}$, $R^{105}$, $R^{106}$, $R^{107}$, $R^{108}$, $R^{109}$ and $R^{110}$ each preferably represents a hydrogen atom, an alkyl group, an aryl group, a heteroaryl group, an alkenyl group, a fluorine atom, a cyano group and an amino group, more preferably an hydrogen atom, an alkyl group, an aryl group and an amino group, and still more preferably an hydrogen atom and an aryl group.

$R^{101}$, $R^{102}$, $R^{103}$, $R^{105}$, $R^{106}$, $R^{107}$, $R^{108}$ and $R^{110}$ each preferably represents a hydrogen atom or an aryl group, and more preferably a hydrogen atom.

$R^{104}$ and $R^{109}$ each preferably represents a hydrogen atom, an aryl group, a heteroaryl group or an amino group, more preferably an heteroaryl group, an aryl group or an amino group, and still more preferably an aryl group.

Hereinafter, formula (2) will be described.

$R^{201}$, $R^{202}$, $R^{203}$, $R^{204}$, $R^{205}$, $R^{206}$, $R^{207}$ and $R^{208}$ each represents a hydrogen atom or a substituent. The substituents include the same group as those recited above as substituents represented by $R^{101}$. The substituents represented by $R^{201}$, $R^{202}$, $R^{203}$, $R^{204}$, $R^{205}$, $R^{206}$, $R^{207}$ and $R^{208}$ may be combined with each other to form a ring structure (for instance, a benzo-condensed ring).

$R^{201}$, $R^{202}$, $R^{203}$, $R^{204}$, $R^{205}$, $R^{206}$, $R^{207}$ and $R^{208}$ each preferably represents a hydrogen atom, an alkyl group, an aryl group, a heteroaryl group, an alkenyl group, a fluorine atom, a cyano group, an amino group (including a diaryl amino group or the like) or a group in which the substituents combine with each other to form a ring structure (for instance, a benzo-condensed ring), more preferably a hydrogen atom, an alkyl group, an aryl group, a diaryl amino group or a group in which the substituents combine with each other to form a ring structure (for instance, a benzo-condensed ring) and still more preferably a hydrogen atom, an aryl group or a group in which the substituents combine with each other to form a ring structure (for instance, a benzo-condensed ring).

$R^{201}$ and $R^{202}$ each preferably represents a hydrogen atom, an aryl group or a group which forms a condensed ring structure when $R^{201}$ and $R^{202}$ are taken together, more preferably an aryl group or a group which forms a condensed ring structure when components are combine, and still more preferably a group which forms a condensed ring structure when components are combines.

$R^{203}$, $R^{204}$, $R^{207}$ and $R^{208}$ each preferably represents a hydrogen atom, an alkyl group or an aryl group, more preferably a hydrogen atom or an aryl group, and still more preferably a hydrogen atom.

$R^{205}$ and $R^{206}$ each preferably represents a hydrogen atom, an aryl group, a group which forms a condensed ring structure (for example a benzo-condensed ring) when $R^{205}$ and $R^{206}$ are taken together, or an amino group (including a diaryl amino group or the like), more preferably a hydrogen atom, a group which forms a condensed ring structure (for example, a benzo-condensed ring) when $R^{205}$ and $R^{206}$ are taken together or a diaryl amino group, and particularly a hydrogen atom or a group which forms a condensed ring structure (for example, a benzo-condensed ring) when $R^{205}$ and $R^{206}$ are taken together.

Hereinafter, formula (3) will be described.

$R^{301}$, $R^{302}$, $R^{303}$, $R^{304}$, $R^{305}$, $R^{306}$, $R^{307}$, $R^{308}$, $R^{309}$, $R^{310}$, $R^{311}$ and $R^{312}$ each represents a hydrogen atom or a substituent. The substituents include the same groups as those recited above as substituents represented by $R^{101}$.

The substituents represented by $R^{301}$, $R^{302}$, $R^{303}$, $R^{304}$, $R^{305}$, $R^{306}$, $R^{307}$, $R^{308}$, $R^{309}$, $R^{310}$, $R^{311}$ and $R^{312}$ may be combined with each other to form a ring structure (for instance, a benzo-condensed ring).

$R^{301}$, $R^{302}$, $R^{303}$, $R^{304}$, $R^{305}$, $R^{306}$, $R^{307}$, $R^{308}$, $R^{309}$, $R^{310}$, $R^{311}$ and $R^{312}$ each preferably represents a hydrogen atom, an alkyl group, an aryl group, a hetero aryl group, an alkenyl group, a fluorine atom, a cyano group, or an amino group (including a diarylamino group or the like), more preferably a hydrogen atom, an alkyl group, an aryl group or a diarylamino group, and still more preferably a hydrogen atom or an aryl group.

$R^{302}$, $R^{305}$, $R^{308}$ and $R^{311}$ preferably represents a hydrogen atom, an aryl group, or an alkyl group, and more preferably a hydrogen atom or an alkyl group.

$R^{301}$, $R^{306}$, $R^{307}$ and $R^{312}$ each preferably represents a hydrogen atom, an aryl group or an amino group (including a diarylamino group or the like), and more preferably a hydrogen atom or a diarylamino group.

$R^{302}$, $R^{303}$, $R^{304}$, $R^{305}$, $R^{308}$, $R^{309}$, $R^{310}$ and $R^{311}$ each preferably represents a hydrogen atom, an aryl group or an alkyl group, more preferably a hydrogen atom or an alkyl group, and still more preferably a hydrogen atom.

Hereinafter, formula (4) will be described.

$R^{401}$, $R^{402}$, $R^{403}$, $R^{404}$, $R^{405}$, $R^{406}$, $R^{407}$, $R^{408}$, $R^{409}$, $R^{410}$, $R^{411}$ and $R^{412}$ each represents a hydrogen atom or a substituent. The substituents include the same groups as those recited above as substituents represented by $R^{101}$. The substituents represented by $R^{401}$, $R^{402}$, $R^{403}$, $R^{404}$, $R^{405}$, $R^{406}$, $R^{407}$, $R^{408}$, $R^{409}$, $R^{410}$, $R^{411}$ and $R^{412}$ may be combined with each other to form a ring structure (for instance, a benzo-condensed ring).

$R^{401}$, $R^{402}$, $R^{403}$, $R^{404}$, $R^{405}$, $R^{406}$, $R^{407}$, $R^{408}$, $R^{409}$, $R^{410}$, $R^{411}$ and $R^{412}$ each preferably represents a hydrogen atom, an alkyl group, an aryl group, a hetero aryl group, an alkenyl group, a fluorine atom, a cyano group or an amino group (including a diarylamino group or the like), more preferably a hydrogen atom, an alkyl group, an aryl group or a diarylamino group, and still more preferably a hydrogen atom or an aryl group.

$R^{401}$, $R^{402}$, $R^{405}$, $R^{406}$, $R^{407}$, $R^{408}$, $R^{411}$ and $R^{412}$ each preferably represents a hydrogen atom, an aryl group or an alkyl group, more preferably a hydrogen atom or an alkyl group, and still more preferably a hydrogen atom.

$R^{403}$, $R^{404}$, $R^{409}$ and $R^{410}$ each preferably represents a hydrogen atom, an aryl group or a hetero aryl group, more preferably an aryl group or a hetero aryl group, and still more preferably an aryl group.

Hereinafter, formula (5) will be described. $R^{501}$, $R^{502}$, $R^{503}$, $R^{504}$, $R^{505}$, $R^{506}$, $R^{507}$, $R^{508}$, $R^{509}$ and $R^{510}$ each represents a hydrogen atom or a substituent. The substituents include the same groups as those recited above as substituents represented by $R^{101}$. The substituents represented by $R^{501}$, $R^{502}$, $R^{503}$, $R^{504}$, $R^{505}$, $R^{506}$, $R^{507}$, $R^{508}$, $R^{509}$ and $R^{510}$ may be combined with each other to form a ring structure (for instance, a benzo-condensed ring).

$R^{501}$, $R^{502}$, $R^{503}$, $R^{504}$, $R^{505}$, $R^{506}$, $R^{507}$, $R^{508}$, $R^{509}$ and $R^{510}$ each preferably represents a hydrogen atom, an alkyl group, an aryl group, a hetero aryl group, an alkenyl group, a fluorine atom, a cyano group or an amino group (including a diarylamino group or the like), more preferably a hydrogen atom, an alkyl group, an aryl group or a diarylamino group, and still more preferably a hydrogen atom or an aryl group.

$R^{502}$, $R^{505}$, $R^{507}$ and $R^{510}$ each preferably represents a hydrogen atom, an aryl group, an alkyl group or an amino group (including a diarylamino group or the like), more preferably a hydrogen atom, an aryl group or a diarylamino group, and still more preferably a hydrogen atom or an aryl group.

$R^{501}$, $R^{503}$, $R^{504}$, $R^{506}$, $R^{508}$ and $R^{509}$ preferably represents a hydrogen atom, an alkyl group or an aryl group, more preferably a hydrogen atom or an aryl group, and still more preferably a hydrogen atom.

In the light emitting device of the invention, the light-emitting layer preferably contains at least one host material, that is a complex. The ions existing in the complex are preferably boron ions or metal ions, more preferably boron ions, magnesium ions, beryllium ions, zinc ions, aluminium ions, gallium ions or indium ions, still more preferably boron ions, zinc ions, aluminium ions or gallium ions, and particularly preferably zinc ions or aluminium ions.

The ligand existing in the complex preferably has, but is not limited to, a bidentate ligand, more preferably a bidentate ligand coordinated in oxygen-nitrogen, a bidentate ligand coordinated in oxygen-oxygen, or a bidentate ligand coordinated in nitrogen-nitrogen, still more preferably a bidentate ligand coordinated in oxygen-nitrogen or a bidentate ligand coordinated in nitrogen-nitrogen, and particularly preferably a bidentate ligand coordinated in oxygen-nitrogen.

The complex of the host material related to the invention is preferably the compounds represented by formulae (11), (12) and (13), (more preferably by formulae (11) and (12), and still more preferably by formula (11); more preferably the compounds represented by formulae (15) and (16) (more preferably by formula (15)); and still more preferably the compound represented by formula (17).

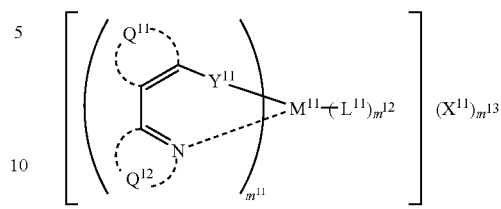

Formula (11)

Formula (12)

Formula (13)

Formula (15)

Formula (16)

-continued

Formula (17)

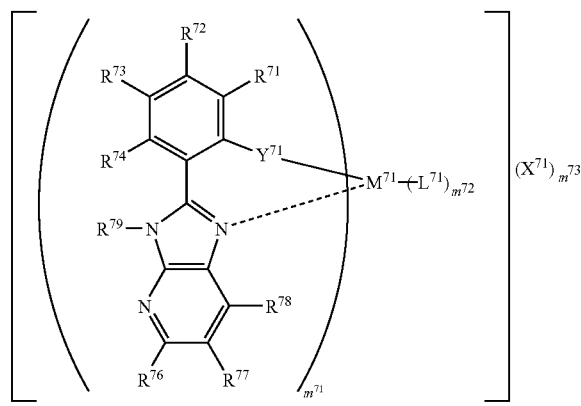

Hereinafter, formula (11) will be described. $M^{11}$ represents a boron ion or a metal ion, preferably a boron ion, a magnesium ion, a beryllium ion, a zinc ion, an aluminium ion, a gallium ion or an indium ion, more preferably a boron ion, a zinc ion, an aluminium ion or a gallium ion, and still more preferably a zinc ion or an aluminum ion.

$Y^{11}$ represents an oxygen atom, a sulfur atom or a substituted or unsubstituted nitrogen atom. Examples of substituents for the nitrogen include an alkyl group (preferably having 1 to 30 carbon atoms, more preferably 1 to 20 carbon atoms, and still more preferably 1 to 10 carbon atoms, such as methyl, ethyl, iso-propyl, tert-butyl, n-octyl, n-desyl, n-hexadecyl, cyclopropyl, cyclopenthyl and cyclohexyl); an alkenyl group (preferably having 2 to 30 carbon atoms, more preferably 2 to 20 carbon atoms, and still more preferably 2 to 10 carbon atoms, such as vinyl, allyl, 2-butenyl and 3-pentenyl); an alkynyl group (preferably having 2 to 30 carbon atoms, more preferably 2 to 20 carbon atoms, and still more preferably 2 to 10 carbon atoms, such as propargyl and 3-pentenyl); an aryl group (preferably having 6 to 30 carbon atoms, more preferably 6 to 20 carbon atoms, and still more preferably 6 to 12 carbon atoms, such as phenyl, p-methylphenyl, naphthyl and anthranyl); an acyl group (preferably having 1 to 30 carbon atoms, more preferably 1 to 20 carbon atoms, and still more preferably 1 to 12 carbon atoms, such as acetyl, benzoyl, formyl and pivaloyl); an alkoxycarbonyl group (preferably having 2 to 30 carbon atoms, more preferably 2 to 20 carbon atoms, and still more preferably 2 to 12 carbon atoms, such as methoxycarbonyl and ethoxycarbonyl); an aryloxycarbonyl group (preferably having 7 to 30 carbon atoms, more preferably 7 to 20 carbon atoms, and still more preferably 7 to 12 carbon atoms, such as phenyloxycarbonyl); a sulfonyl group (preferably having 1 to 30 carbon atoms, more preferably 1 to 20 carbon atoms, and still more preferably 1 to 12 carbon atoms, such as mesyl and tosyl); a heterocyclic group (preferably having 1 to 30 carbon atoms, and more preferably 1 to 12 carbon atom, and containing for example a nitrogen atom, an oxygen atom, or a sulfur atom as hetero atoms, specifically imidazolyl, pyridyl, quinolyl, furyl, thienyl, piperidyl, morpholino, benzoxazolyl, benzimidazolyl, benzthiazolyl, a carbazolyl group, an azepinyl group); and a silyl group (preferably having 3 to 40 carbon atoms, more preferably 3 to 30 carbon atoms, and still more preferably 3 to 24 carbon atoms, such as trimethylsilyl and triphenylsilyl. These substituents may in turn be substituted.

$Y^{11}$ is preferably an oxygen atom or a substituted nitrogen atom (the substituent is preferably an acyl group, a sulfonyl group or a phosphonyl group), and more preferably an oxygen atom.

$Q^{11}$ represents an atom group necessary to form an aromatic ring. Aromatic ring formed by $Q^{11}$ includes a benzene ring, a naphthalene ring, a phenanthrene ring, an anthracene ring, a pyridine ring, a pyrazine ring, a pyrimidine ring, a triazine ring, a pyrazole ring, an imidazole ring, a triazole ring, an oxazole ring, a thiazole ring, a furan ring, a thiophene ring, and condensed rings thereof (benzothiophene or the like), preferably a benzene ring or a pyridine ring, and still more preferably a benzene ring.

The aromatic ring formed by $Q^{11}$ may have a substituent. The substituents include those recited above as substitutes represented by $R^{101}$.

The substituents for $Q^{11}$ are preferably an alkyl group, an alkenyl group, an aryl group, a heteroaryl group, a fluorine atom or an alkoxy group, more preferably an alkyl group or an aryl group, and still more preferably an alkyl group.

$Q^{12}$ represents an atom group necessary to form a nitrogen-containing heterocyclic ring. The nitrogen-containing heterocyclic ring formed by $Q^{12}$ includes, but is not limited to, a pyridine ring, a pyrazine ring, a pyrimidine ring, a pyridazine ring, a triazine ring, a thiazole ring, an oxazole ring, a pyrrole ring, an imidazole ring, a pyrazole ring, a triazole ring, an oxadiazole ring, a thiadiazole ring and condensed rings containing these heterocyclic rings (for example, a quinolin ring, a benzoxazole ring, a benzimidazole ring, an indolenine ring, or an imidazopyridine ring), preferably a pyridine ring, a benzoxazole ring, a benzimidazole ring or an imidazopyridine ring, more preferably a pyridine ring, a benzimidazole ring, or an imidazopyridine ring, and still more preferably an imidazopyridine ring.

The nitrogen-containing heterocyclic ring formed by $Q^{12}$ may have a substituent. Examples of the substituent include the same substituents as those described above as representing $Q^{11}$ and the preferred ranges of $Q^{11}$ and $Q^{12}$ are also the same as one another.

$L^{11}$ represents a ligand. The ligands include those described in H. Yersin, "Photochemistry and Photophysics of Coordination Compounds", Springer-Verlag (1987), and Yamamoto Akio, "Yukikinzokukagaku-kiso to ohyo-", Shokabo Publishing Co. (1982). Preferred ligands include substituted oxy ligands ((metal oxo ligands (for instance, aluminium oxo ligands having ligand substituted), siloxy ligands (triphenyl siloxy), aryloxy ligands (biphenyl oxy), alkoxy ligands (isopropoxy), arylthio ligands (phenylthio), alkylthio ligands (t-butylthio group)), halogen ligands (for instance, chlorine and fluorine), nitrogen-containing heterocyclic ligands (for instance, bipyridyl, phenanthroline, phenylpyridine, pyrazolylpyridine, benzimidazolylpyridine, picoline, thienylpyridine, pyrazolylpyridine, imidazolylpyridine, triazolylpyridine, pyrazolylbenzoxazole, and condensed rings thereof (for instance, phenylquinoline, benzothienylpyridine, and biquinoline)), diketone ligands (for instance, acetylacetone), nitrile ligands (for instance, acetonitrile), a CO ligand, isonitrile ligands (for instance, t-butylisonitrile), phosphorus ligands (for instance, phosphinic acid derivatives, phosphorous ester derivatives, and phosphinine derivatives), and carboxylic acid ligands (for instance, acetic acid). More preferred among them are diketone ligands, bidentate nitrogen-containing heterocyclic ligands, and substituted oxy ligands. Still more preferred are bidentate nitrogen-containing heterocyclic ligands, and substituted oxy ligands.

$X^{11}$ represents a counter ion. The counter ions include, but are not limited to, an alkali metal ion, an alkaline earth metal ion, a halide ion, a perchlorate ion, a $PF_6$ ion, an ammonium ion (for instance, a tetramethylammonium ion), a borate ion and a phosphonium ion, and more preferably a perchlorate ion and a $PF_6$ ion.

$m^{11}$ represents 1 to 4, preferably 1 or 3, and more preferably 2 or 3. When $m^{11}$ is two or greater, plural bidentate ligands may be the same or different.

$m^{12}$ represents 0 to 4, preferably 0 or 2, more preferably 0 or 1, and still more preferably 0. When $m^{12}$ is two or greater, plural $L^{11}$ may be the same or different.

$m^{13}$ represents 0 to 3, preferably 0 or 1, and more preferably 0.

Hereinafter, formula (12) will be described.

$M^{21}$, $Q^{22}$, $L^{21}$, $X^{21}$, $m^{21}$, $m^{22}$ and $m^{23}$ have the same meanings as $M^{11}$, $Q^{12}$, $L^{11}$, $X^{11}$, $m^{11}$, $m^{12}$ and $m^{13}$, respectively, and preferred ranges of $M^{21}$, $Q^{22}$, $L^{21}$, $X^{21}$, $m^{21}$, $m^{22}$ and $m^{23}$ are the same as for $M^{11}$, $Q^{12}$, $L^{11}$, $X^{11}$, $m^{11}$, $m^{12}$ and $m^{13}$ respectively.

$Q^{21}$ represents an atom group necessary to form a nitrogen-containing aromatic ring. The nitrogen-containing heterocyclic rings formed by $Q^{21}$ include, but are not limited to, a pyrrole ring, an imidazole ring, a pyrazole ring, a triazole ring and condensed rings containing these heterocyclic rings (an indole ring, a benzimidazole ring and a benzpyrazole ring or the like), preferably a pyrrole ring, an imidazole ring, a pyrazole ring, an indole ring or a benzimidazole ring, more preferably a pyrazole ring, an indole ring, or a benzimidazole ring, and still more preferably a pyrazole ring.

Hereinafter, formula (13) will be described.

$M^{31}$, $Y^{31}$, $Q^{31}$, $Q^{32}$, $L^{31}$, $X^{31}$, $m^{31}$, $m^{32}$ and $m^{33}$ have the same meanings as $M^{11}$, $Y^{11}$, $Q^{11}$, $Q^{12}$, $L^{11}$, $X^{11}$, $m^{11}$, $m^{12}$ and $m^{13}$ respectively, and preferred ranges of $M^{31}$, $Y^{31}$, $Q^{31}$, $Q^{32}$, $L^{31}$, $X^{31}$, $m^{31}$, $m^{32}$ and $m^{33}$ are also the same as for $M^{11}$, $Y^{11}$, $Q^{11}$, $Q^{12}$, $L^{11}$, $X^{11}$, $m^{11}$, $m^{12}$ and $m^{13}$ respectively.

Hereinafter, formula (15) will be described.

$M^{51}$, $Y^{51}$, $L^{51}$, $X^{51}$, $m^{51}$, $m^{52}$ and $m^{53}$ have the same meanings as $M^{11}$, $Y^{11}$, $L^{11}$, $X^{11}$, $m^{11}$, $m^{12}$ and $m^{13}$ respectively, preferred ranges of $M^{51}$, $Y^{51}$, $L^{51}$, $X^{51}$, $m^{51}$, $m^{52}$ and $m^{53}$ are also the same as for $M^{11}$, $Y^{11}$, $L^{11}$, $X^{11}$, $m^{11}$, $m^{12}$ and $m^{13}$ respectively.

$R^{51}$, $R^{52}$, $R^{53}$ and $R^{54}$ each represents a hydrogen atom or a substituent. The substituents may be combined with each other to form a structure (for instance, a benzene ring, a pyridine ring, a naphthalene ring or a phenanthrene ring). Examples of the substituents include the same groups as those described above represented by the substituent for $Q^{11}$.

$R^{51}$, $R^{52}$, $R^{53}$, and $R^{54}$ represent a hydrogen atom, an alkyl group, an alkoxy group, an aryl group, a halogen atom and a group in which the substituents combine with each other to form an aromatic ring, preferably a hydrogen atom, an alkyl group, a group in which the substituents combine with each other to form an aromatic ring, and still more preferably a hydrogen atom.

$R^{55}$ and $R^{56}$ each represents a substituent. The substituents may be taken together to form a ring structure. $R^{55}$ and $R^{56}$ are preferably an alkyl group, an aryl group, a heteroaryl group, or a group in which the substituents are taken together to form an aromatic ring, more preferably an aryl group or a group in which the substituents are taken together to form an aromatic ring, and still more preferably a group in which the substituents are taken together to form an aromatic ring, and particularly preferably a group in which the substituents are taken together to form a nitrogen-containing heterocyclic ring.

$Y^{52}$ represents an oxygen atom, a sulfur atom, or a substituted or unsubstituted nitrogen atom. $Y^{52}$ preferably represents an oxygen atom, a substituted nitrogen atom (the substituent for the nitrogen atom is preferably an alkyl group, an aryl group or a heteroaryl group, more preferably an alkyl group or an aryl group, and still more preferably an aryl group.), more preferably a substituted nitrogen atom, and still more preferably an aryl group.

Hereinafter, formula (16) will be described.

$M^{61}$, $L^{61}$, $X^{61}$, $m^{61}$, $m^{62}$ and $m^{63}$ have the same meanings as $M^{51}$, $L^{51}$, $X^{51}$, $m^{51}$, $m^{52}$ and $m^{53}$ respectively, and preferred ranges of $M^{61}$, $L^{61}$, $X^{61}$, $m^{61}$, $m^{62}$ and $m^{63}$ are also the same as for $M^{51}$, $L^{51}$, $X^{51}$, $m^{51}$, $m^{52}$ and $m^{53}$ respectively.

$R^{61}$, $R^{62}$, $R^{63}$ and $R^{64}$ each represents a hydrogen atom or a substituent. The substituents may be combined with each other to form a ring structure (for instance, a benzene ring, a pyridine ring, a naphthalene ring or a phenanthrene ring). Examples of the substituents include the same groups as those already described and represented by the substituent for $Q^{11}$.

$R^{61}$, $R^{62}$, $R^{63}$ and $R^{64}$ each preferably represents a hydrogen atom, an alkyl group, an alkoxy group, an aryl group, a halogen atom, or a group in which the substituents combine with each other to form an aromatic ring, more preferably a hydrogen atom, an alkyl group or a group in which the substituents are taken together to form an aromatic ring, and still more preferably a hydrogen atom.

$Y^{61}$, $Y^{62}$ and $Y^{63}$ each represents a nitrogen atom or a substituted or unsubstituted carbon atom. Examples of substituents for the carbon atom include the same groups as those already described and represented by the substituent for $Q^{11}$. $Y^{61}$ preferably represents on nitrogen atom. $Y^{62}$ preferably represents a substituted or unsubstituted carbon atom (an alkyl group or an aryl group is preferable as the substituent), and more preferably a substituted carbon atom. $Y^{63}$ preferably represents a substituted or unsubstituted carbon atom, and an unsubstituted carbon atom is more preferred.

Hereinafter, formula (17) will be described.

$M^{71}$, $Y^{71}$, $L^{71}$, $X^{71}$, $m^{71}$, $m^{72}$, $m^{73}$, $R^{71}$, $R^{72}$, $R^{73}$ and $R^{74}$ have the same meanings as $M^{51}$, $Y^{51}$, $L^{51}$, $X^{51}$, $m^{51}$, $m^{52}$, $m^{53}$, $R^{51}$, $R^{52}$, $R^{53}$ and $R^{54}$ respectively. Preferred ranges of $M^{71}$, $Y^{71}$, $L^{71}$, $X^{71}$, $m^{71}$, $m^{72}$, $m^{73}$, $R^{71}$, $R^{72}$, $R^{73}$ and $R^{74}$ are also the same as for $M^{51}$, $Y^{51}$, $L^{51}$, $X^{51}$, $m^{51}$, $m^{52}$, $m^{53}$, $R^{51}$, $R^{52}$, $R^{53}$ and $R^{54}$ respectively.

$R^{79}$ represents a substituent, preferably an alkyl group, an aryl group or a heteroaryl group, more preferably an alkyl group or an aryl group, and still more preferably an aryl group.

$R^{76}$, $R^{77}$ and $R^{78}$ each represents a hydrogen atom or a substituent. The substituents may be combined with each other to form a ring structure. Examples of substituents include the same groups as those already described and represented by the substituent for $Q^{11}$. $R^{76}$, $R^{77}$ and $R^{78}$ each preferably represents a hydrogen atom, an alkyl group, an aryl group, a heteroaryl group or a group in which the substituents are taken together to form a ring structure, more preferably a hydrogen atom, an alkyl group or an aryl group, still more preferably a hydrogen atom or an alkyl group, and particular preferably a hydrogen atom.

The light-emitting device of the invention preferably has an electron-transporting layer, preferably containing a non-complex compound. The non-complex compound is preferably, but is not limited to, a nitrogen-containing heterocyclic compound.

The nitrogen-containing heterocyclic compound is preferably, but not limited to, a 6-membered ring aromatic nitrogen-containing heterocyclic compound, or a 5-membered ring aromatic nitrogen-containing heterocyclic compound, more preferably pyridine, pyrazine, pyrimidine, triazine, quinoxaline, quinoline, pyrrole, pyrazole, imidazole, oxazole, thiazole, oxadiazole, thiadiazole and derivatives of these compounds (for instance, tetraphenylpyridine, benzoimidazole, and imidazopyridine), still more preferably an imidazole derivative and particularly preferably an imidazopyridine derivative.

The nitrogen-containing heterocyclic compound composing the electron-transporting layer of the invention is preferably among the compounds represented by formulae (18) and (19), more preferably compound represented by formula (19), and still more preferably compound represented by formula (20).

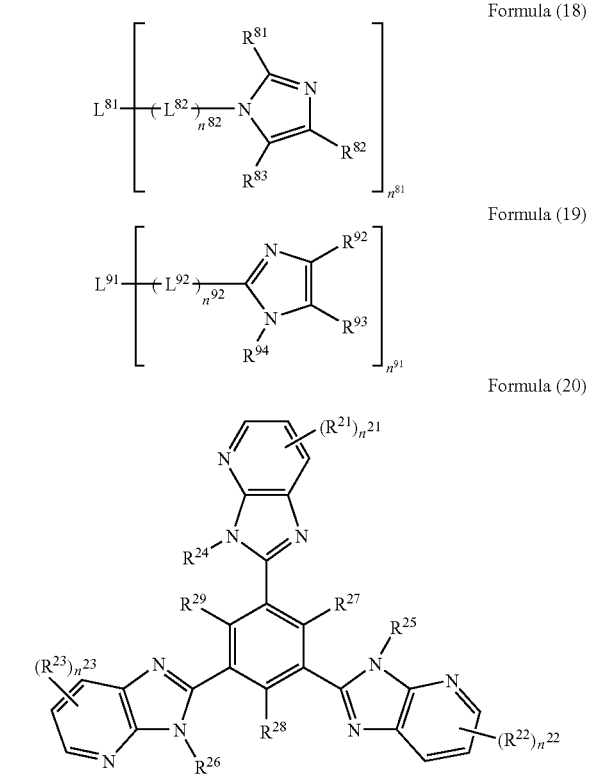

Formula (18)

Formula (19)

Formula (20)

Hereinafter, formula (18) will be described.

$R^{81}$, $R^{82}$ and $R^{83}$ each represents a hydrogen atom or a substituent. Examples of the substituents include the same groups as those already described and represented by $R^{101}$.

$R^{81}$ preferably represents an alkyl group, an aryl group or a heteroaryl group. An alkyl group or an aryl group are more preferred. An alkyl group is particularly preferred.

$R^{82}$ and $R^{83}$ each represents an alkyl group, an aryl group, a heteroaryl group or a group in which the substituents combine with each other to form an aromatic ring. A group in which the substituents combine with each other to form an aromatic ring is more preferred.

$L^{81}$ represents a linking group. $L^{81}$ is preferably an aryl linking group, a heteroaryl linking group or an alkyl linking group. An aryl linking group and a heteroaryl linking group are more preferred, and a nitrogen-containing heteroaryl linking group is particularly preferred.

$n^{81}$ represents an integer of 2 or more. $n^{81}$ is preferably 2 to 6, and more preferably 3 to 4.

$L^{82}$ represents a divalent linking group. $L^{82}$ preferably represents an alkylene group, an arylene group, a heteroarylene group, an oxygen linking group, a carbonyl linking group or an amino linking group. An alkylene group or an arylene group are more preferred.

$n^{82}$ represents an integer of 0 to 6, preferably 0 to 3, and more preferably 0 and 1. When $n^{82}$ is two or more, plural of $L^{82}$ may be the same or different.

Hereinafter, formula (19) will be described. $R^{92}$ and $R^{93}$ each represents a hydrogen atom or a substituent. Examples of substituents include the same groups as those already described and represented by $R^{101}$.

$R^{92}$ and $R^{93}$ each represents an alkyl group, an aryl group, a heteroaryl group or a group in which substituents combine with each other to form an aromatic ring. A group in which substituents combine with each other to form an aromatic ring is more preferred. A group which forms a nitrogen-containing aromatic ring is particularly preferred.

$R^{94}$ represents a hydrogen atom or a substituent. Examples of substituents include the groups represented by the substituent of the substituted nitrogen atom. $R^{94}$ preferably represents an alkyl group, an aryl group, or a heteroaryl group, more preferably an aryl group or a heteroaryl group, and particularly preferably an aryl group.

$L^{91}$, $L^{92}$, $n^{91}$ and $n^{92}$ have the same meanings as $L^{81}$, $L^{82}$, $n^{81}$ and $n^{82}$ respectively, and preferred ranges of $L^{91}$, $L^{92}$, $n^{91}$ and $n^{92}$ are also the same as for $L^{81}$, $L^{82}$, $n^{81}$ and $n^{82}$ respectively.

Hereinafter, formula (20) will be described.

$R^{21}$, $R^{22}$ and $R^{23}$ each represents a substituent. Examples of substituents include the same groups as those already described and represented by $R^{101}$. $R^{21}$, $R^{22}$ and $R^{23}$ each represents an alkyl group, an aryl group, a heteroaryl group or a fluorine atom. An alkyl group or an aryl group is more preferred, and an aryl group is particularly preferred.

$n^{21}$, $n^{22}$ and $n^{23}$ each represents an integer of 0 to 3, preferably 0 to 1, and more preferably 0. When $n^{21}$, $n^{22}$ and $n^{23}$ are two or more, plural $R^{21}$, $R^{22}$ and $R^{23}$ may be the same or different.

$R^{24}$, $R^{25}$ and $R^{26}$ each represents a substituent. Examples of substituents include the same groups as those already described above and represented by the substituent of the substituted nitrogen atom. $R^{24}$, $R^{25}$ and $R^{26}$ preferably represents an alkyl group, an aryl group, or a heteroaryl group, more preferably an aryl group or a heteroaryl group, and still more preferably an aryl group.

$R^{27}$, $R^{28}$ and $R^{29}$ each represents a hydrogen atom or a substituent. Examples of substituents include the same groups as those already described and represented by $R^{101}$. $R^{27}$, $R^{28}$ and $R^{29}$ preferably represents a hydrogen atom, an alkyl group or an aryl group, more preferably a hydrogen atom or an aryl group, and particularly preferably a hydrogen atom.

From the points of view of the response of light emission and of durability, it is preferably that the light emitting device of the invention has at least a hole-transporting layer, a light-emitting layer and an electron-transporting layer, and the light-emitting layer contains a compound emitting fluorescence at a time that voltage is applied, and relative to the total light emission obtained from the device, the light emission from the compound emitting fluorescence contained in the light-emitting layer is preferably 80% or more, more preferably 85% or more, and still more preferably 90% or more.

In addition to light emission from the fluorescent light-emitting compound contained in the light-emitting layer, light emission obtained from the device includes light emission from an amplifying agent, light emission from a host material, light emission from an electron-transporting layer, and light emission from a hole-transporting layer.

It is preferable to keep light emission from the amplifying agent at a low rate and thus enhance the response of the light emission. Further, a reduction in light emission from the host material, the electron-transporting layer or the hole-transporting layer is equivalent to a reduction in light emission which is not amplified, and this is preferable from the point of view of enhancing the efficiency of the device.

In the device of the invention, a difference between the maximum light-emitting wavelength of the compound emitting fluorescence at a time that voltage is applied and that of the amplifying agent is preferably within the range of from −20 nm to 70 nm, more preferably within −10 nm to 65 nm, and still more preferably within −5 nm to 60 nm. In this context, a difference of the maximum light-emitting wavelength means "(maximum light-emitting wavelength (nm) of compound emitting light fluorescence)−(maximum light-emitting wavelength (nm) of amplifying agent)".

A value pertaining at a time when the device is made to emit light at 20° C. can be used as the maximum light-emitting wavelength of the compound emitting fluorescence at a time that voltage is applied. The value of light emission derived from a sensitizer (an amplifying agent), or the value of a photo luminescence of a solid film obtained by mixing the sensitizer with a host material, can be used as the maximum light-emitting wavelength of the sensitizer.

In this invention, the maximum light-emitting wavelength of the device was measured by PMA-11 (trade name, manufactured by Hamamatsu Photonics K.K.), and photo luminescence was measured by RF-5300PC (trade name, manufactured by Shimadzu Corporation).

In the organic electroluminescent device of this invention, the difference between the maximum light-emitting wavelength of the amplifying agent and the absorption maximum wavelength of the compound emitting fluorescence at a time that the voltage is applied is preferably within a range of from −20 nm to 60 nm, more preferably of −20 nm to 50 nm, still more preferably of −20 nm to 40 nm, and particularly preferably of −20 nm to −30 nm. In this context, the difference of the absorption maximum wavelength means "(maximum light-emitting wavelength of amplifying agent)−(absorption maximum wavelength of compound emitting light fluorescence at a time that voltage is applied)". A value in a solid film at 20° C. or a value in a solution (a solvent such as toluene or chloroform, with a concentration $1 \times 10^{-5}$ mol/L or the like), can be used as the absorption maximum wavelength of the compound emitting fluorescence. In the invention, the absorption maximum wavelength was measured by using a time-of-flight apparatus.

It is preferable that the light emitting device of the invention further has a hole-transporting layer, a light-emitting layer and an electron-transporting layer, and that the light-emitting layer contains a compound emitting fluorescence at a time that voltage is applied, an amplifying agent and a host material. In the interests of efficiency and durability, it is also preferable that an external quantum efficiency of the device obtained by replacing with an amplifying agent a fluorescent light-emitting compound of which the intensity of light emission is amplified by the amplifying agent is 10% or more, more preferably 15% or more, still more preferably 18% or more, and particularly preferably 21% or more. The device of Reference Example 1 is one in which the compound emitting fluorescence in Example 1 (Compound B) is replaced with an amplifying agent (Ir (ppy)$_3$).

The light-emitting device of the invention which has a hole-transporting layer, a light-emitting layer and an electron-transporting layer preferably has neither a hole blocking layer nor an exciton-blocking layer between the light-emitting layer and the electron-transporting layer. Further, it is preferable that only one electron-transporting layer be disposed between the light-emitting layer and the electrode.

The hole-blocking layer performs a function of blocking holes injected from the anode. Further, the exciton-blocking layer performs a function of blocking excitons generated in the light-emitting layer and thus limiting the light-emitting area. BCP is an appropriate material for these layers.

In view of the driving voltage and in the interests of efficiency, an ionization potential of the host material contained in the light-emitting layer of the invention is preferably within a range of from 5.9 eV to 6.3 eV, more preferably within a range of from 5.95 eV to 6.25 eV, and still more preferably within a range of from 6.0 eV to 6.2 eV.

In view of driving voltage and in the interests of efficiency, the degree of electron mobility of the host material related to the invention is preferably within a range of from $1 \times 10^{-6}$ Vs/cm to $1 \times 10^{-1}$ Vs/cm, more preferably within a range of from $5 \times 10^{-6}$ Vs/cm to $1 \times 10^{-2}$ Vs/cm, still more preferably within a range of from $1 \times 10^{-5}$ Vs/cm to $1 \times 10^{-2}$ Vs/cm, and particularly preferably within a range of from $5 \times 10^{-5}$ Vs/cm to $1 \times 10^{-2}$ Vs/cm.

In view of the driving voltage and in the interests of efficiency, the degree of hole mobility of the host material related to the invention is preferably within a range of from $1 \times 10^{-6}$ Vs/cm to $1 \times 10^{-1}$ Vs/cm, more preferably within a range of from $5 \times 10^{-6}$ Vs/cm to $1 \times 10^{-2}$ Vs/cm, still more preferably within a range of from $1 \times 10^{-5}$ Vs/cm to $1 \times 10^{-2}$ Vs/cm, and particularly preferably within a range of from $5 \times 10^{-5}$ Vs/cm to $1 \times 10^{-2}$ Vs/cm.

In the interests of efficiency, the fluorescence wavelength in a film state of the host material contained in the light-emitting layer related to the invention is preferably within a range of from 400 nm to 650 nm, more preferably within a range of from 420 nm to 600 nm, and still more preferably from 440 nm to 550 nm.

The light-emitting device of the invention preferably emits light at the central part of the light-emitting layer. If the compound which quenches the triplet excitons exists in adjacent layers (the hole-transporting layer, the exciton blocking layer (or the hole blocking layer) and the electron-transporting layer), a decrease in external quantum efficiency is smaller (for instance, within 20%) than in a case in which the material which quenches the triplet excitons does not exist. In contrast, the position of the light emission can be estimated on the basis at a decrease in external quantum efficiency.

From the point of view of heat resistance, the glass transition point of the host material contained in the light-emitting layer of the invention is preferably within a range of from 90° C. to 400° C., more preferably within the range of from 100° C. to 380° C., still more preferably within the range of from 120° C. to 370° C., and particularly preferably within the range of from 140° C. to 360° C.

It is preferable that the light emitting device of the invention has at least a hole-transporting layer, a light-emitting layer and an electron-transporting layer, and that from the point of view of efficiency, the light-emitting layer has at least one of alternately laminated structures made up of a layer containing at least one compound emitting fluorescence at a time when voltage is applied, and a layer having at least one amplifying agent. The light-emitting layer preferably has an alternately laminated structure of 10 or more layers, more preferably 12 or more layers, and still more preferably 16 or more layers.

It is preferable that the light-emitting device of the invention has a light-emitting layer with an alternately laminated structure having a layer containing at least one compound emitting fluorescence at a time that voltage is applied and a layer containing at least one amplifying agent, and the thickness of the layer containing the amplifying agent is 4 nm or less. The thickness of the layer containing the amplifying agent is more preferably within a range of from 0.1 to 4 nm, and particularly preferably within a range of from 0.5 to 2 nm.

In the light-emitting device having alternately laminated film of the invention, it is preferable to fabricate the alternately laminated film by means of a process containing the following steps (a) to (c):

(a) depositing a compound emitting fluorescence, or a mixture of such compounds, wherein an amplifying agent, or a mixture thereof, is blocked by a shutter positioned in the vicinity of the source of deposition, and the amplifying agent, or a mixture of such agents, is thereby prevented from being deposited on the device which is being fabricated.

(b) depositing an amplifying agent, or a compound thereof, wherein the compound emitting fluorescence, or a mixture of such compounds, is blocked by a shutter positioned in the vicinity of the source of deposition, and the compound emitting fluorescence, or a mixture of such compounds, is prevented from being deposited on the device which is being fabricated.

(c) repeating steps (a) and (b).

Each step is initiated by means of a switch opening or shutting the shutter positioned in the vicinity of the source of deposition. For instance, the process later described in Example 1 is an example of this.

In the light-emitting device having the alternately laminated film related to the invention, it is preferable to fabricate the alternately laminated film by means of a process containing the following steps (a) to (c):

(a) depositing the amplifying agent, or a compound thereof, wherein the compound emitting fluorescence, or a mixture of such compounds, is blocked by the shutter positioned in the vicinity of the source of deposition, and the compound emitting fluorescence, or a mixture of such compounds, is prevented from being deposited on the device which is being fabricated.

(b) depositing the compound emitting fluorescence, or a mixture of such compounds, wherein the amplifying agent, or a mixture thereof, is blocked by the shutter positioned in the vicinity of the source of deposition, and the amplifying agent, or a mixture thereof, is prevented from being deposited on the device which is being fabricated.

(c) repeating the steps (a) and (b).

Each step is initiated by a switch opening or shutting the shutter positioned in the vicinity of the source of deposition.

In the interests of facility of fabrication for a device of the invention, it is also preferable that light emitting layer be a single layer.

The compound related to the invention (the compound emitting fluorescence, the amplifying agent, the host material, the electron transportation material and the hole transportation material) may be either a low-molecular compound or a polymeric compound, including an oligomer, having a weight average molecular weight (polystyrene conversion) of preferably within a range of from 1000 to 5000000, more preferably from 2000 to 1000000, and still more preferably from 3000 to 100000. The compound related to the invention is preferably a low-molecular compound.

Next, examples of complex compounds used as the host material in the light-emitting layer related to the invention, are described below, but the invention is not limited thereto.

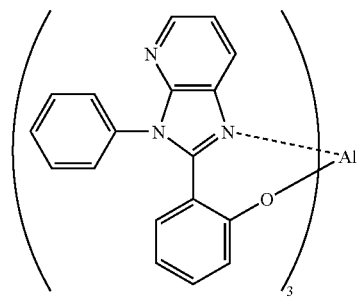

1

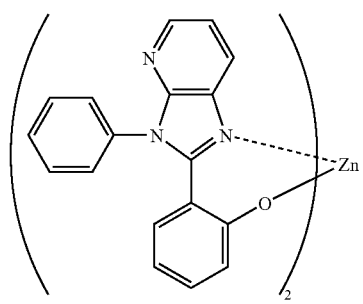

2

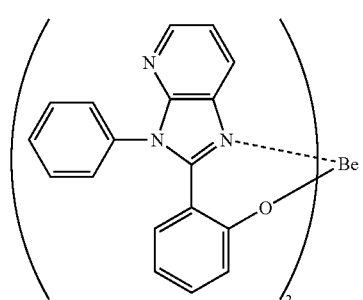

3

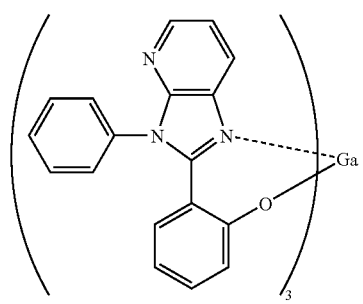

4

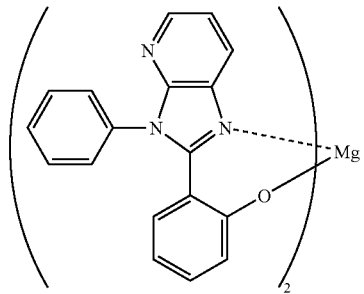

5

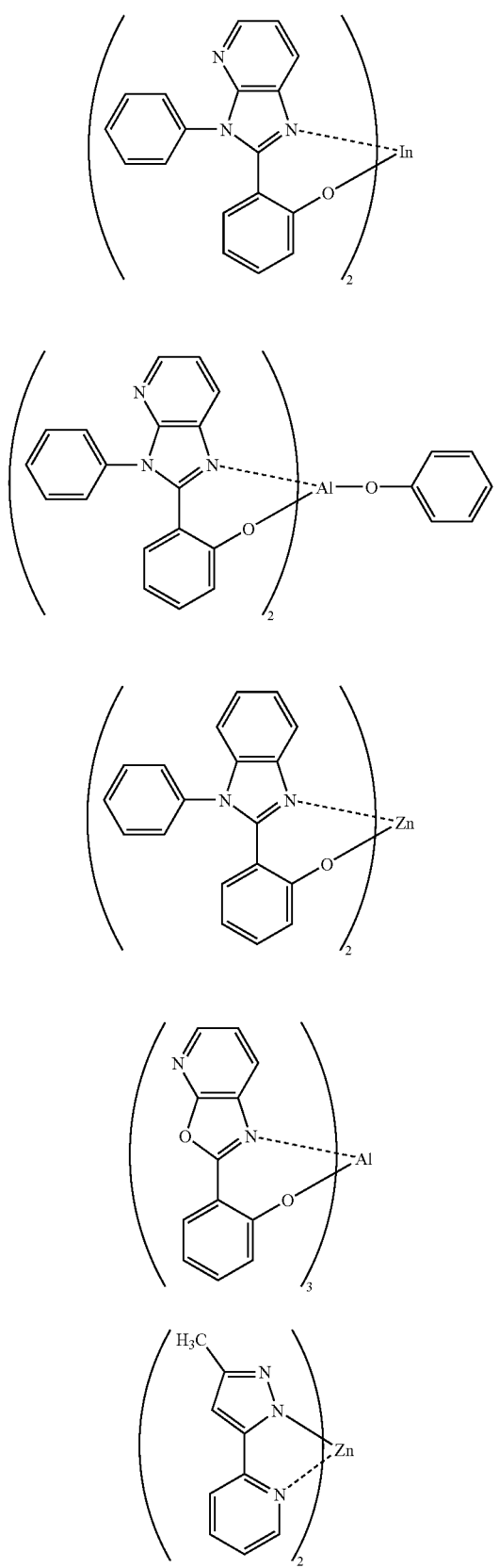

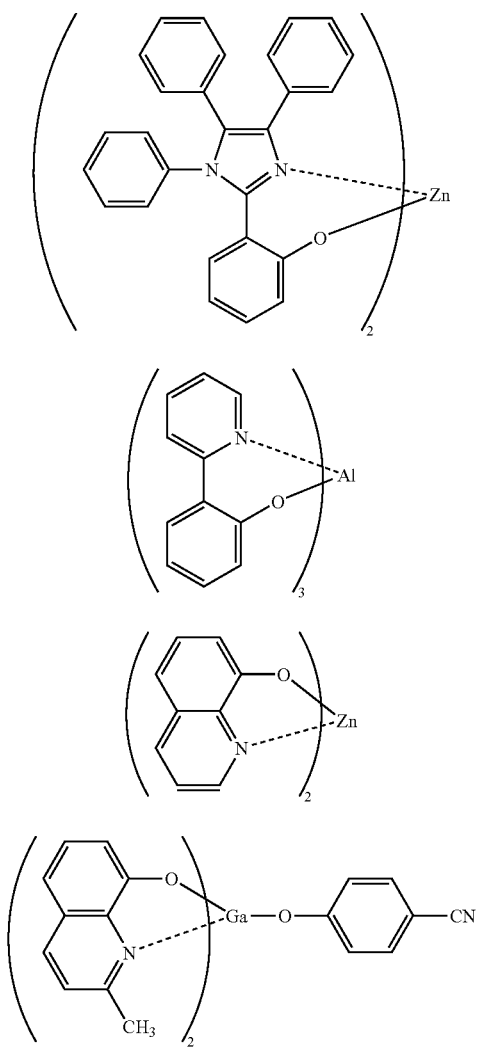
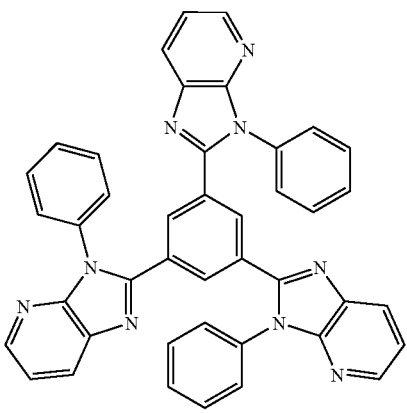
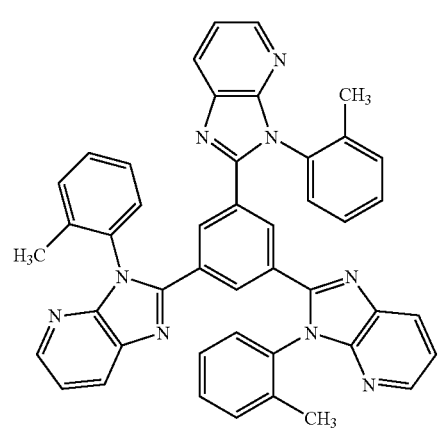
As the non-complex compound in the electron-transporting layer invention, the nitrogen-containing heterocyclic compounds are bed below, but the invention is not limited thereto.
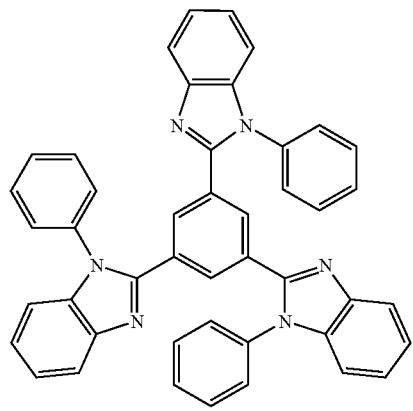
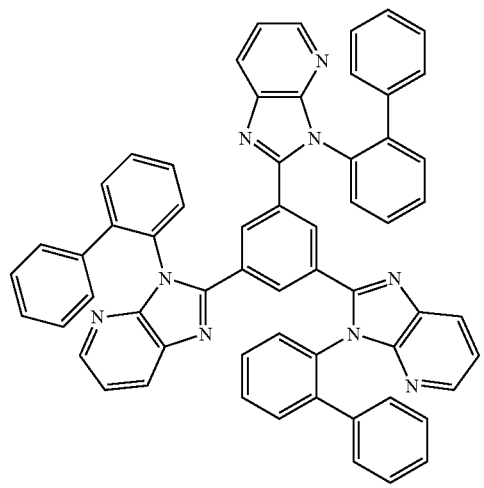

-continued
105
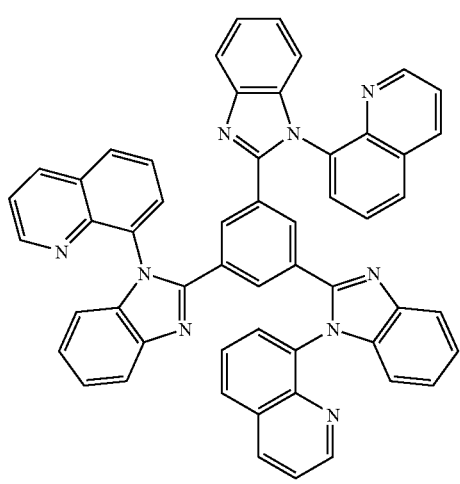
106
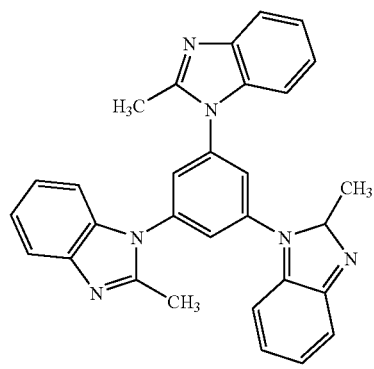
107
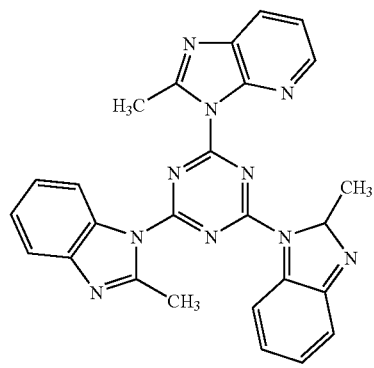
108
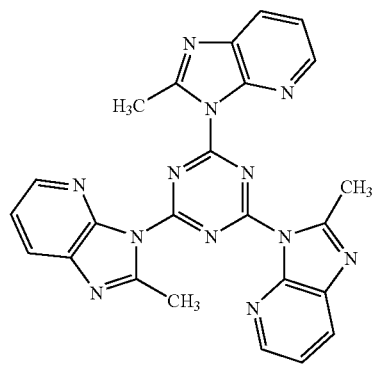
As the fluorescent compound in the light-emitting layer of the invention infused aromatic compounds are described below, but the invention is not limited thereto.
201
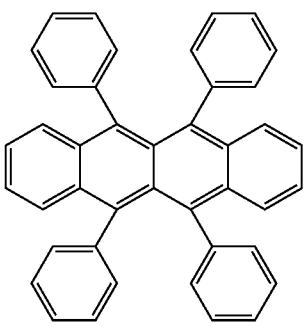
202
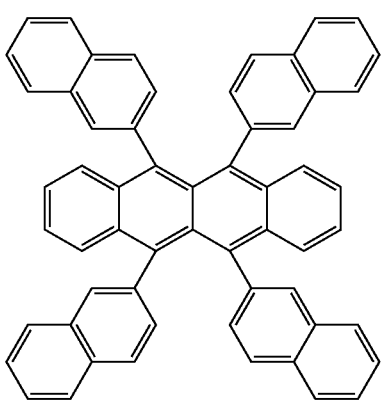
203
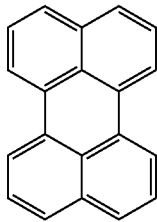
204
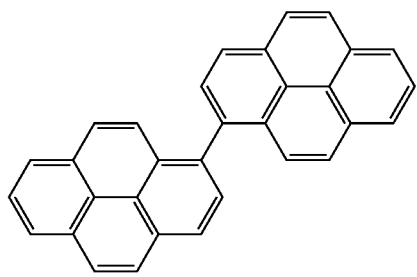
206
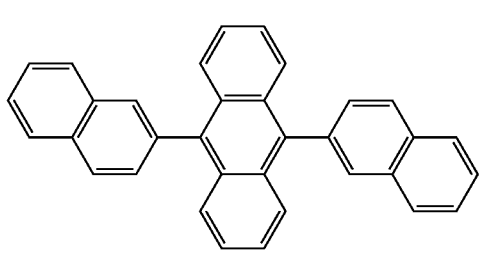

-continued

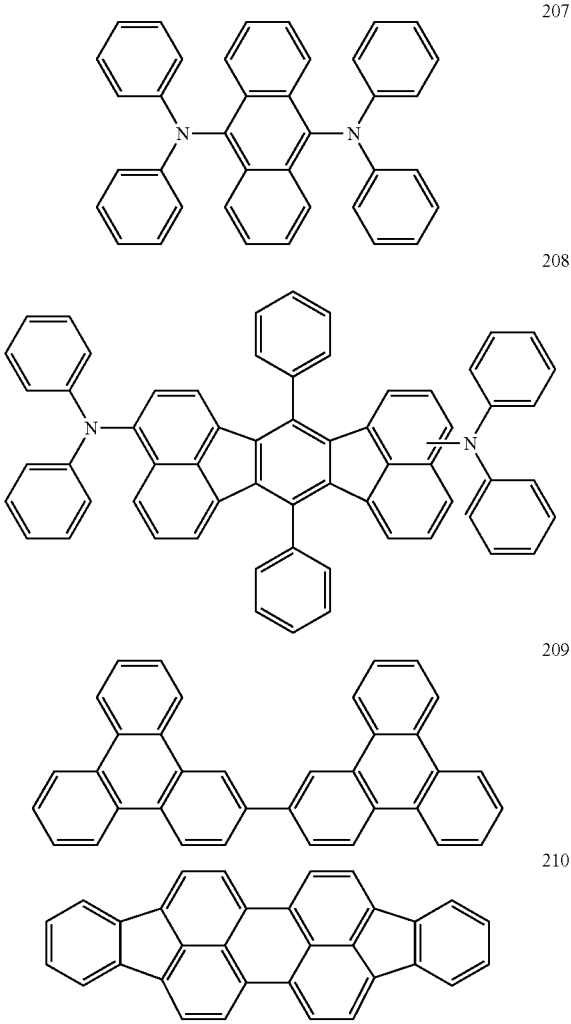

Next, the light-emitting device of the invention containing the compound will be described.

The light-emitting device of the invention is not limited by configuration, driving mode, use, and so forth. The organic EL (electroluminescence) device described below is a typical one.

Methods for forming an organic layer in the light-emitting device of the invention include, but are not limited to, vacuum deposition by resistance heating, electron beam, sputtering, molecular accumulation, coating (such as spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating and screen coating), an ink jet method, printing, and transfer. From the standpoint of film characteristics and production, resistance heating vacuum deposition, coating, and transfer are preferred.

The light emitting device of the invention is a device having a light-emitting layer, or plural organic compound films containing the light-emitting layer, positioned between a pair of electrodes, an anode and a cathode. In addition to the light-emitting layer, the light emitting device may have additional layers, such as a hole injection layer, a hole-transporting layer, an electron-injecting layer, an electron-transporting layer, and a protective layer. Each of these layers may also perform functions other than the ones implied by the designation of the layer. These layers can also be formed of various materials.

The anode supplies positive holes to organic compound layers, such as a hole-injecting layer, a hole-transporting layer, and a light-emitting layer. Materials making up the anode include metals, alloys, metal oxides, electrically conductive compounds, and mixtures thereof. Materials having a work function of 4 eV or higher are preferred.

Examples of useful materials are electrically conductive metal oxides, such as tin oxide, zinc oxide, indium oxide, and indium tin oxide (ITO); metals, such as gold, silver, chromium, and nickel; mixtures or laminates of these metals and electrically conductive metal oxides; inorganic electrically conductive substances, such as copper iodide and copper sulfide; organic electrically conductive substances, such as polyaniline, polythiophene, and polypyrrole; and laminates of these materials and ITO. Conductive metal oxides are preferred, and ITO is especially preferred for its productivity, electrical conductivity, and transparency.

The thickness of the anode is appropriately determined, depending on the material, but usually preferably ranges from 10 nm to 5 μm, more preferably from 50 nm to 1 μm, and still more preferably from 100 to 500 nm.

The anode is usually used as formed on a substrate, such as a soda lime glass plate, an alkali-free glass plate or a transparent resin plate. When a glass substrate is chosen, alkali-free glass is preferred, from the point of view of avoiding leaching of ions from glass. When soda lime glass is used, it is preferable that such a glass have a barrier coat of silica or the like. The thickness of the substrate is not particularly limited as long as the device can preserve mechanical strength. However, a glass substrate, for example, usually has a thickness of 0.2 mm or greater, and preferably 0.7 mm or greater.

The anode is formed by technique appropriate to the type of material. For instance, an ITO layer is formed by electron beam deposition, sputtering, resistance heating vacuum deposition, a chemical reaction (for instance, a sol-gel process) application of an ITO dispersion or the like.

The anode thus formed may be subjected to cleaning or a like treatment for reducing the driving voltage, or for enhancing luminescence efficiency. For an ITO anode, for instance, an UV-ozone treatment or a plasma treatment is effective.

The cathode supplies electrons to the organic layers such as an electron-injecting layer, an electron-transporting layer, and a light-emitting layer. The material making up the cathode is selected taking into consideration factors such as adhesion to an adjacent layer, such as an electron-injecting layer, an electron-transporting layer or a light-emitting layer, ionization potential and stability.

Useful materials include metals, alloys, metal halides, metal oxides, electrically conductive compounds, and mixtures thereof. Examples of useful materials are alkali metals (for instance, Li, Na, and K) and fluorides or oxides thereof, alkaline earth metals (for instance, Mg and Ca) and fluorides or oxides thereof, gold, silver, lead, aluminum, sodium-potassium alloys or mixtures thereof, lithium-aluminum alloys or mixtures thereof, magnesium-silver alloys or mixtures thereof, and rare earth metals (for instance, indium and ytterbium). Preferable materials thereof are those having a work function of 4 eV or less, more preferably aluminum, lithium-aluminum alloys or mixtures thereof, and magnesium-silver alloys or mixtures thereof.

The cathode has a single layer structure composed of the materials described above, or a laminate structure containing the materials described above. For example, an aluminum/lithium fluoride laminate structure or an aluminum/lithium oxide laminate structure is preferred. The thickness of the cathode is appropriately selected depending on the material, but usually preferably ranges from 10 nm to 5 µm, more preferably from 50 nm to 1 µm, and still more preferably from 100 nm to 1 µm.

The cathode can be formed by methods such as electron beam deposition, sputtering, resistance heating vacuum deposition, coating and transfer. In vacuum deposition, a single metal may be deposited, or two or more components may be deposited simultaneously. Furthermore, plural metals may be deposited simultaneously to form an alloy cathode, or alternatively a previously formulated alloy may be deposited.

The anode and the cathode each preferably has as low a sheet resistance as possible, specifically a sheet resistance of several hundreds of ohms per square or less.

Any materials can be used to make the light-emitting layer, as long as, at a time when an electrical field is applies, the resulting layer can receive positive holes from the anode, from a hole-injecting layer or from a hole-transporting layer; and can receive electrons from the cathode, from an electron-injecting layer or from an electron-transporting layer, and as long as the resulting layer can provide a site where the holes and electrons can be transported and recombined to cause light emission. In addition to the compounds used in the invention and already mentioned above, useful materials for making the light-emitting layer include benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, cyclopentadiene, styrylamine and aromatic dimethylidyne compounds; various metal complexes exemplified by metal complexes or rare earth element complexes of 8-quinolinol; polymer compounds, such as polythiophene, polyphenylene, and polyphenylene vinylene; organic silanes; transition metal complexes exemplified by an iridium-trisphenylpyridine complex and a platinum-porphyrin complex; and derivatives of these compounds, in addition to the amplifying agent and the host material mentioned above.

The thickness of the light-emitting layer is not particularly limited, but is usually within a range of from 1 nm to 5 µm, preferably from 5 nm to 1 µm and more preferably from 10 nm to 500 nm.

Methods of forming the light-emitting layer include, but are not limited to, resistance heating vacuum deposition, electron beam deposition, sputtering, molecular accumulation, coating, an ink jet method, printing, the LB method, and transfer. Resistance heating vacuum deposition and coating methods are preferred.

The light-emitting layer can be made of a single compound or plural compounds. The light-emitting layer can also have one or more light-emitting layers. Two or more light-emitting layers may emit light of different colors to emit white light as a whole. A single light-emitting layer can be designed to emit white light. Each of two or more light-emitting layers may be made of a single material, or of a mixture of two or more materials.

Any materials, hereinafter, referred to as "hole-injecting or hole-transporting material", can be used to form the hole-injecting layer and the hole-transporting layer, as long as the resulting layer performs at least one of a function of injecting holes supplied by the anode, a function of transporting holes, and a function of blocking the electrons injected from the cathode. Examples of such materials include the compounds of the invention; carbazole, triazole, oxazole, oxadiazole, imidazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole) and aniline copolymers; conductive polymer oligomers, such as thiophene oligomers and polythiophene; organic silanes; and derivatives of these compounds. A carbon membrane can also be useful.

The thicknesses of the hole-injecting layer and the hole-transporting layer are not particularly limited, but are usually within a range of from 1 nm to 5 µm, preferably from 5 nm to 1 µm and more preferably from 10 nm to 500 nm. The hole-injecting layer and the hole-transporting layer may each have a single layer structure made of one or more of the materials mentioned above or a multilayer structure containing two or more layers having the same or different compositions.

The hole-injecting layer and the hole-transporting layer are each formed by, for example, vacuum deposition, the LB method, wet coating with a solution or dispersion of a hole-injecting or transporting material in a solvent, an ink jet method, printing, or transfer. When wet coating techniques are adopted, it is possible to apply a resin component as a solute or dispersoid, together with the hole-injecting or transporting material. Applicable resin components include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

Any materials (hereinafter, referred to as "electron-injecting or electron-transporting materials") can be used to make up the electron-injecting layer and the electron-transporting layer, as long as the resulting layer performs at least one of a function of injecting electrons from the cathode, a function of transporting the electrons, and a function of blocking positive holes from the anode. Such materials include the compounds of the invention; triazole, oxazole, oxadiazole, imidazole, fluorenone, anthraquinodimethane, anthrone, diphenylquinone, thiopyran dioxide, carbodiimide, fluorenylidenemethane, distyrylpyrazine, aromatic (for instance, naphthalene or perylene) tetracarboxylic acid anhydrides and phthalocyanine; various metal complexes, such as metal complexes of 8-quinoliol, metallo-phthalocyanines, and metal complexes having benzoxazole or benzothiazole as a ligand; organic silanes; and derivatives of these compounds. The thicknesses of the electron-injecting layer and the electron-transporting layer are not particularly limited, but usually preferably range from 1 nm to 5 µm, more preferably from 5 nm to 1 µm and still more preferably from 10 nm to 500 nm. The electron-injecting layer and the electron-transporting layer may each have a single layer structure made of one or more of the materials mentioned above, or a multilayer structure containing two or more layers having the same or different compositions.

The electron-injecting layer and the electron-transporting layer are each formed by, for example, vacuum deposition, the LB method, wet coating with a solution or dispersion of an electron-injecting or transporting material in a solvent, an ink jet method, printing, or transfer. When wet coating techniques are adopted, it is possible to apply a resin component as a solute or dispersoid together with the electron-injecting or transporting material. Applicable resin components include those enumerated above with respect to the hole-injecting and hole-transporting layer.

The protective layer related to the invention can be of any material that prevents from entering the device substances such as moisture and oxygen, which may accelerate deterioration of the device. Such materials include metals, such as In, Sn, Pb, Au, Cu, Ag, Al, Ti, and Ni; metal oxides, such as MgO, SiO, SiO$_2$, Al$_2$O$_3$, GeO, NiO, CaO, BaO, Fe$_2$O$_3$, Y$_2$O$_3$ and TiO$_2$; metal fluorides, such as MgF$_2$, LiF, AlF$_3$, and CaF$_2$; nitrides, such as SiN$_x$ and SiO$_x$N$_y$; polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymers, copolymer copolymerized tetrafluoroethylene with monomer mixtures containing at least one comonomer, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, coating techniques, printing, and transfer.

The light emitting device of the invention is suited for use in fields such as display devices, displays, backlights, light sources for electrophotography, illumination, recording, exposure or reading, signs or signboards, interior decorations and optical communications.

EXAMPLES

The present invention will now be illustrated in greater detail with reference to Examples, but it should be understood that the invention is not deemed to be limited thereto.

Comparative Example 1

A Device Described in WO 01/008230

A cleaned ITO substrate was set in a vacuum deposition apparatus. N,N'-diphenyl-N,N'-di(m-tolyl)benzidine (TPD) was deposited on the substrate to a thickness of 60 nm. Then, CBP and DCM2 were deposited on the TPD layer at a ratio of 99:1 to a deposition thickness of 1 nm. CBP and Ir(ppy)$_3$ were deposited thereon at a ratio of 90:10 to a deposition thickness of 1 nm. The process was repeated 5 times, and an alternate laminated film of 10 nm in total was formed in 10 layers. Then, BCP was deposited thereon to a deposition thickness of 20 nm. Then, Alq$_3$ was deposited thereon to a deposition thickness of 30 nm. A pattern mask (having a pattern giving a light-emitting area of 4 mm by 5 mm) was put on the organic thin film which had been thus formed, and magnesium and silver were deposited at a ratio of 25:1 to a thickness of 100 nm in a vacuum evaporation apparatus. Finally, silver was deposited to a thickness of 50 nm. By applying a constant DC voltage to the resulting EL device with a Source-Measure Unit Model 2400 (trade name, manufactured by Toyo Corp.), red light emission was obtained and luminance was measured with a luminance meter BM-8 (trade name, manufactured by Topcon Corp.). An external quantum efficiency at 200 cd/m$^2$ was 2.6%. Further, in the light emission spectrum, light emission from Ir (ppy)$_3$ and light emission from CBP were mixed with the light emission from DCM2 (with the same result as in WO 01/008230).

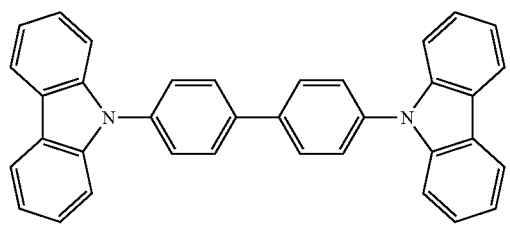

CBP

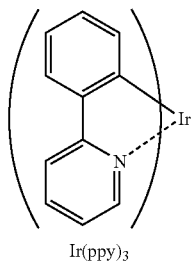

Ir(ppy)$_3$

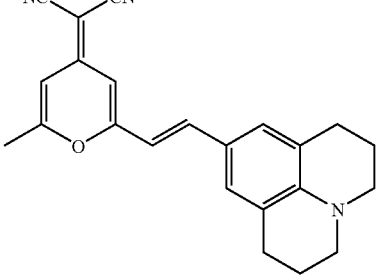

DCM2

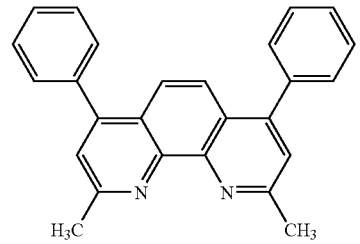

BCP

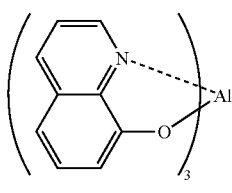

Alq$_3$

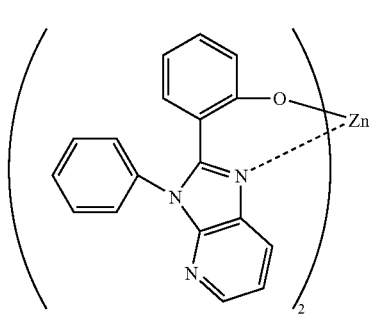

Compound A

-continued

Compound B

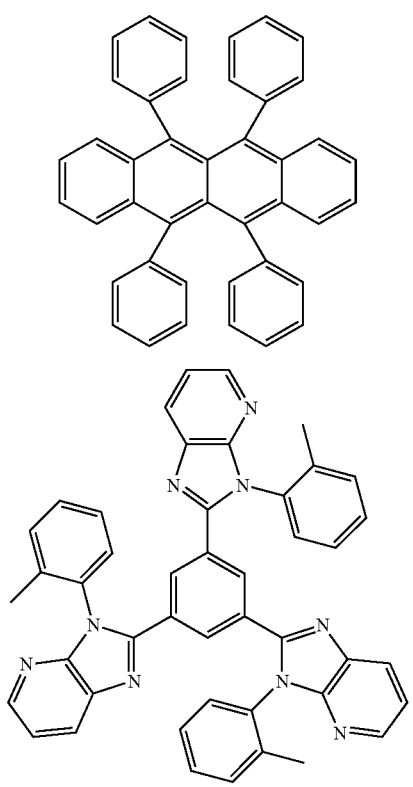

Compound C

Example 1

A cleaned ITO substrate was set in a vacuum deposition apparatus. N,N'-diphenyl-N,N'-di(m-tolyl)benzidine (TPD) was deposited on the substrate to a thickness of 50 nm. Then, a compound A (host material) and a compound B (compound emitting fluorescence) were deposited on the TPD layer in a ratio of 99:1 to a deposition thickness of 1 nm. Then compound A and Ir(ppy)$_3$ (amplifying agent) were deposited on the TPD layer in a ratio of 17:1 to a deposition thickness of 1 nm. This process was repeated 18 times, and an alternate laminated film of 36 nm in total was formed. In this case, a crucible in which compound A and compound B had been poured and a crucible in which compound A and Ir(ppy)$_3$ had been poured were heated to temperatures at which the crucibles could be constantly deposited. Deposition was repeated by the switching of a shutter set in the vicinity of the crucible. A compound C was deposited thereon to a deposition thickness of 36 nm. A pattern mask (having a pattern giving a light-emitting area of 4 mm by 5 mm) was put on the organic thin film thus formed, and lithium fluoride was deposited to a thickness of 3 nm. Finally, aluminium was deposited to a thickness of 200 nm. On applying a constant DC voltage to the resulting EL device with the use of a Source-Measure Unit Model 2400 (trade name, manufactured by Toyo Corp.), light emission was obtained and luminance was measured with a luminance meter BM-8 (trade name, manufactured by Topcon Corp.). The light emission spectrum of the device was measured by a photonic multichannel analyzer PMA-11 (trade name, manufactured by Hamamatsu Photonics K.K.). As a result, yellow light emission of a maximum light-emitting wavelength λ max=565 nm and CIE chromaticity (x,y)=(0.43, 0.54) were obtained, and the external quantum efficiency at 200 cd/m$^2$ was 15.8%. The internal quantum efficiency was calculated to be 79%. The light emission was mainly derived from compound B. The proportion accounted for by the fluorescent luminescence of compound B was calculated from the light emission spectrum, and found to be about 84%. The approximately 16% remaining was accounted for by the phosphorescence luminescence derived from Ir(ppy)$_3$. The light emission spectrum is shown in FIG. 1, and the relationship between the luminance and the external quantum efficiency is shown in FIG. 2.

Example 2

Alq$_3$ was used in place of compound C in Example 1, and the device was fabricated and tested in the same manner as in Example 1. As a result, the yellow light emission of maximum light-emitting wavelength λ max=565 nm and CIE chromaticity (x,y)=(0.47, 0.51) were obtained, and the external quantum efficiency at 200 cd/m$^2$ was 11.7%. The internal quantum efficiency was calculated to be 58.5%. The light emission was mainly derived from compound B. The proportion accounted for by the fluorescent luminescence of compound B was about 95%. The approximately 5% remaining was accounted for by phosphorescence luminescence derived from Ir (ppy)$_3$.

Example 3

CBP was used in place of compound A in Example 1, and the device was fabricated and tested in the same manner as in Example 1. As a result, the yellow light emission of maximum light-emitting wavelength λ max=550 nm and CIE chromaticity (x,y)=(0.37, 0.56) were obtained, and the external quantum efficiency at 200 cd/m$^2$ was 8.1%. The internal quantum efficiency was calculated to be 40.5%. The light emission was mainly derived from compound B. The proportion accounted for by the fluorescent luminescence of compound B was about 90%. The approximately 10% remaining was accounted for by phosphorescence luminescence derived from Ir(ppy)$_3$.

Example 4

Except for repeating the deposition steps five times, that is, as in Example 1, depositing compound A and compound B at a ratio of 99:1 to a deposition thickness of 1 nm, and then depositing thereon compound A and Ir(ppy)$_3$ at a ratio of 17:1 to a deposition thickness of 1 nm, thus producing a deposition thickness of 10 nm, the device was fabricated and tested in the same manner as in Example 1. As a result, the yellow light emission of maximum light-emitting wavelength λ max=553 nm and CIE chromaticity (x,y)=(0.47, 0.55) were obtained, and the external quantum efficiency at 200 cd/m$^2$ was 9.3%. The internal quantum efficiency was calculated to be 46.5%. The light emission was mainly derived from compound B. The proportion accounted for by the fluorescent luminescence of compound B was about 83%. The approximately 17% remaining was accounted for by phosphorescence luminescence derived from Ir (ppy)$_3$.

Example 5

CBP was used instead of compound A used in Example 4, and the device was fabricated and tested in the same manner as in Example 4. As a result, the yellow light emission of maximum light-emitting wavelength λ max=553 nm and CIE chromaticity (x,y)=(0.41, 0.55) were obtained, and the external quantum efficiency at 200 cd/m$^2$ was 6.3%. The internal quantum efficiency was calculated to be 31.5%. The light emission was mainly derived from compound B. The proportion accounted for by the fluorescent luminescence of compound B was about 91%. The approximately 9% remaining was accounted for by phosphorescence luminescence derived from Ir (ppy)$_3$.

Example 6

Except for repeating the deposition steps six times, that is, as in Example 1, depositing compound A and compound B at a ratio of 99:1 to a deposition thickness of 1 nm, and then depositing thereon compound A and Ir(ppy)$_3$ at a ratio of 17:1 to a deposition thickness of 1 nm, thus producing a deposition thickens of 12 nm, the device was fabricated and tested in the same manner as in Example 1. As a result, the yellow light emission of maximum light-emitting wavelength λ max=553 nm and CIE chromaticity (x,y)=(0.43, 0.55) were obtained, and the external quantum efficiency at 200 cd/m$^2$ was 11.2%. The internal quantum efficiency was calculated to be 56%. The light emission was mainly derived from compound B. The proportion accounted for by the fluorescent luminescence of compound B was about 87%. The approximately 13% remaining was accounted for by phosphorescence luminescence derived from Ir (ppy)$_3$.

Reference Example 1

Instead of depositing compound A and compound B at a ratio of 99:1 to a deposition thickness of 1 nm, as in Example 1, compound A and Ir(ppy)$_3$ were deposited at a ratio of 17:1 to a deposition thickness of 1 nm and the device was fabricated and tested in the same manner as in Example 1. Phosphorescence luminescence derived from Ir(ppy)$_3$, and of which λ max was 510 nm, was obtained, and the external quantum efficiency at 200 cd/m$^2$ was 23%.

Reference Example 2

Instead of depositing compound A and Ir(ppy)$_3$ at a ratio of 17:1 to a deposition thickness of 1 nm, as in Example 1, compound A and compound B were deposited at a ratio of 99:1 to a deposition thickness of 1 nm. As a result, fluorescent light-emission derived from compound (B) (rubrene) was obtained, and the external quantum efficiency at 200 cd/m$^2$ was 1.7%.

Reference Example 3

Instead of depositing CBP and compound B at a ratio of 99:1 to a deposition thickness of 1 nm, as in Example 3, CBP and Ir (ppy)$_3$ were deposited at a ratio of 17:1 to a deposition thickness of 1 nm, and the device was fabricated and tested in the same manner as in Example 3. Phosphorescence luminescence derived from Ir (ppy)$_3$ was obtained, and the external quantum efficiency at 200 cd/m$^2$ was 15%.

By comparing the relationship between Example 1 and Reference Example 1, and the relationship between Example 3 and Reference Example 3, it is evident that the higher the external quantum efficiency of the device, in which the fluorescent light-emitting compound (compound B) was replaced with Ir (ppy)$_3$, the higher the efficiency.

Further by comparing the relationship between Example 1 and Example 4 and 6, and the relationship between Example 3 and Example 5, it is evident that larger number of laminated films as a light emitting layer in the alternately laminated structure is preferable. The number of laminated film is preferably 10 or more, more preferably 12 or more.

Example 7

Except for, as in Example 1, depositing compound A and Ir(ppy)$_3$ at a ratio of 17:1 to a deposition thickness of 4 nm so as to produce a total deposition thickness of 90 nm, as a light emitting layer of 90 nm, the device was fabricated and tested in the same manner as in Example 1. As a result, the yellow light emission of maximum light-emitting wavelength λ max=553 nm and CIE chromaticity (x,y)=(0.43, 0.52) were obtained, and the external quantum efficiency at 200 cd/m$^2$ was 6.2%. The internal quantum efficiency was calculated to be 31%. The light emission was mainly derived from compound B. The proportion accounted for by the fluorescent luminescence of compound B was about 80%. The approximately 20% remaining was accounted for by phosphorescence luminescence derived from Ir (ppy)$_3$.

By comparing the relationship between Example 1 and Example 7, it is evident that the less the thinner thickness of the layer containing the amplifying agent, the better. The thickness of a layer containing the amplifying agent is preferably 4 nm or less.

Example 8

A cleaned ITO substrate was set in a vacuum deposition apparatus. N,N'-diphenyl-N,N'-di(m-tolyl)benzidine (TPD) was deposited on the substrate to a thickness of 50 nm. Then, compound A, Ir(ppy)$_3$ and compound B were deposited on the TPD layer in a ratio of 94:5:1 to a total deposition thickness of 36 nm. Then compound C was deposited thereon to a deposition thickness of 36 nm. A pattern mask (having a pattern giving a light-emitting area of 4 mm by 5 mm) was put on the organic thin film thus formed, and lithium fluoride was deposited to a thickness of 3 nm. Finally, aluminium was deposited to a thickness of 200 nm. Then the resulting device was tested in the same manner as in Example 1. As a result, yellow light emission of a maximum light-emitting wavelength λ max=565 nm and CIE chromaticity (x,y)=(0.43, 0.54) were obtained, and the external quantum efficiency at 200 cd/m$^2$ was 11.8%. The internal quantum efficiency was calculated to be 59%. The light emission was mainly derived from compound B. The proportion accounted for by the fluorescent luminescence of compound B was calculated from the light emission spectrum, and found to be about 93%. The approximately 7% remaining was accounted for by the phosphorescence luminescence derived from Ir(ppy)$_3$.

Example 9

CBP was used instead of compound A used in Example 8, and the device was fabricated and tested in the same manner as in Example 8. As a result, the yellow light emission of maximum light-emitting wavelength λ max=553 nm and CIE chromaticity (x,y)=(0.45, 0.55) were obtained, and the external quantum efficiency at 200 cd/m$^2$ was 7.3%. The internal quantum efficiency was calculated to be 36.5%. The light emission was mainly derived from compound B. The proportion accounted for by the fluorescent luminescence of compound B was about 96%. The approximately 4% remaining was accounted for by phosphorescence luminescence derived from Ir (ppy)$_3$.

Reference Example 4

Instead of depositing compound A, Ir(ppy)$_3$ and compound B in a ratio of 94:5:1, as in Example 8, compound A and Ir (ppy)₃ were deposited at a ratio of 95:5, and the device was fabricated and tested in the same manner as in Example 8. Phosphorescence luminescence derived from Ir (ppy)₃ was obtained, and the external quantum efficiency at 200 cd/m² was 21%.

Reference Example 5

Instead of depositing CBP, Ir(ppy)₃ and compound B in a ratio of 94:5:1, as in Example 9, CBP and Ir (ppy)₃ were deposited in a ratio of 95:5, and the device was fabricated and tested in the same manner as in Example 9. Phosphorescence luminescence derived from Ir (ppy)₃ was obtained, and the external quantum efficiency at 200 cd/m² was 19%.

From the results of Example 8 and 9, it is evident that a high efficiency of light emission was also obtained from a device having in the same layer a host material, an amplifying agent and a compound emitting fluorescence. Also, by comparing the relationship between Example 1 and Example 8, and the relationship between Example 3 and Example 9, it is evident that a device having an alternately laminated structure has higher efficiency of light emission than a device containing in the same layer a host material, an amplifying agent and compound emitting fluorescence in the same layer. Further, a device having an amplifying agent and compound emitting fluorescence in the same layer, that is a device having one light emitting layer, is preferable from the point of view of facility of fabrication.

Furthermore, by comparing the relationship between Example 8 and Reference Example 4, and the relationship between Example 9 and Reference Example 5, it is evident that, even in a comparison of devices having a host material and an amplifying agent in the same layer, the higher the external quantum efficiency of a device in which compound B has been replaced with Ir (ppy)₃, the better this is from the point of view of efficiency.

The invention claimed is:

1. An organic electroluminescent device comprising a substrate and at least one organic layer containing a light-emitting layer between a pair of electrodes, wherein the light-emitting layer contains at least one host material,
    wherein the organic electroluminescent device contains a compound emitting fluorescence at a time that voltage is applied, and a light emission at the time that voltage is applied is mainly derived from a light emission from the fluorescent compound, and
    an external quantum efficiency of the device is 6% to 15.8%;
    wherein the compound emitting fluorescence is represented by one of the following formulae (1)-(5):

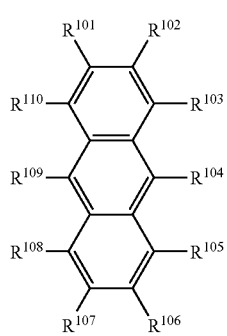

Formula (1)

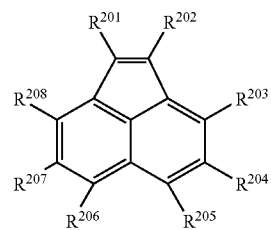

Formula (2)

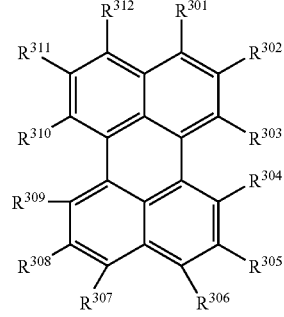

Formula (3)

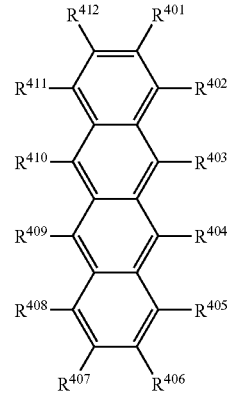

Formula (4)

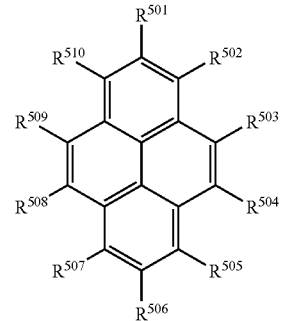

Formula (5)

wherein $R^{101}$, $R^{102}$, $R^{103}$, $R^{105}$, $R^{106}$, $R^{107}$, $R^{108}$, $R^{110}$, $R^{201}$, $R^{202}$, $R^{203}$, $R^{204}$, $R^{205}$, $R^{206}$, $R^{207}$, $R^{208}$, $R^{301}$, $R^{302}$, $R^{303}$, $R^{304}$, $R^{305}$, $R^{306}$, $R^{307}$, $R^{308}$, $R^{309}$, $R^{310}$, $R^{311}$, $R^{312}$, $R^{401}$, $R^{402}$, $R^{403}$, $R^{404}$, $R^{405}$, $R^{406}$, $R^{407}$, $R^{408}$, $R^{409}$, $R^{410}$, $R^{411}$, $R^{412}$, $R^{501}$, $R^{502}$, $R^{503}$, $R^{504}$, $R^{505}$, $R^{506}$, $R^{507}$, $R^{508}$, $R^{509}$, and $R^{510}$ each individually represents a hydrogen atom, an alkyl group, an alkenyl group, an alkynyl group, an aryl group, an amino group, an alkoxy group, an aryloxy group, a heterocyclic oxy group, an acyl group, an alkoxy carbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxyl group, a mercapto group, a halogen atom, a cyano group, a sulfo group, a carboxyl group, a nitro group, a hydroxamic acid group, a sulfino group, a hydrazino group, an imino group, a heterocyclic group, a silyl group, or a silyloxy group, wherein $R^{104}$ and $R^{109}$ each individually represents a hydrogen atom, an aryl group, a heteroaryl group, or an amino group.

2. The organic electroluminescent device according to claim 1, wherein an internal quantum efficiency of the organic electroluminescent device is 30% or more.

3. The organic electroluminescent device according to claim 1 or 2, wherein the organic electroluminescent device contains an amplifying agent performing a function of amplifying a number of singlet excitons generated at the time that voltage is applied, thus amplifying an intensity of the light emission.

4. The organic electroluminescent device according to claim 3, wherein the amplifying agent is a transition metal complex.

5. The organic electroluminescent device according to claim 3, wherein a concentration of the amplifying agent contained in the light-emitting layer is 9 weight % or less.

6. The organic electroluminescent device according to claim 3, wherein a difference between the maximum light-emitting wavelength of the compound emitting fluorescence at the time that voltage is applied, and a maximum light-emitting wavelength of the amplifying agent, is 70 nm or less.

7. The organic electroluminescent device according to claim 3, wherein a difference between the maximum light-emitting wavelength of the amplifying agent, and an absorption maximum wavelength of the compound emitting fluorescence at the time that voltage is applied, is −20 nm or more.

8. The organic electroluminescent device according to claim 3, wherein the organic electroluminescent device has a hole-transporting layer, the light-emitting layer and an electron-transporting layer, and the light-emitting layer has at least one alternately laminated structure including a layer containing at least one compound emitting fluorescence at a time that voltage is applied and a layer containing at least one amplifying agent.

9. The organic electroluminescent device according to claim 8, wherein the light-emitting layer has an alternately laminated structure of ten or more layers.

10. The organic electroluminescent device according to claim 1, wherein a maximum light-emitting wavelength from the compound emitting fluorescence is 580 nm or less.

11. The organic electroluminescent device according to claim 1, wherein the host material is a complex.

12. The organic electroluminescent device according to claim 1, wherein the organic electroluminescent device has an electron-transporting layer, and the electron-transporting layer contains a non-complex compound.

13. The organic electroluminescent device according to claim 1, wherein the organic electroluminescent device has a hole-transporting layer, the light-emitting layer and the electron-transporting layer, and a light emission from the compound emitting fluorescence is 80% or more of a total light emission obtained from the organic electroluminescent device.

14. The organic electroluminescent device according to claim 1, wherein the organic electroluminescent device has a hole-transporting layer, the light-emitting layer and an electron-transporting layer, and has neither a hole blocking layer nor an exciton blocking layer between the light-emitting layer and the electron-transporting layer.

* * * * *